(12) United States Patent
Uchida et al.

(10) Patent No.: US 10,103,773 B2
(45) Date of Patent: Oct. 16, 2018

(54) SEMICONDUCTOR DEVICE AND COMMUNICATION CIRCUIT

(71) Applicant: RENESAS ELECTRONICS CORPORATION, Tokyo (JP)

(72) Inventors: Shinichi Uchida, Tokyo (JP); Takafumi Kuramoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 19 days.

(21) Appl. No.: 15/617,738

(22) Filed: Jun. 8, 2017

(65) Prior Publication Data

US 2017/0359097 A1 Dec. 14, 2017

(30) Foreign Application Priority Data

Jun. 9, 2016 (JP) .................................. 2016-115317

(51) Int. Cl.

| | |
|---|---|
| *H04B 1/44* | (2006.01) |
| *H01L 49/02* | (2006.01) |
| *H01L 23/58* | (2006.01) |
| *H01L 23/528* | (2006.01) |
| *H01L 23/552* | (2006.01) |
| *H03F 3/195* | (2006.01) |
| *H01L 27/06* | (2006.01) |
| *H03B 5/12* | (2006.01) |

(Continued)

(52) U.S. Cl.
CPC ............. *H04B 1/44* (2013.01); *H01L 23/528* (2013.01); *H01L 23/5226* (2013.01); *H01L 23/5227* (2013.01); *H01L 23/552* (2013.01); *H01L 23/585* (2013.01); *H01L 27/0629* (2013.01); *H01L 28/10* (2013.01); *H03B 5/1228* (2013.01); *H03F 3/195* (2013.01); *H03F 3/213* (2013.01); *H04B 5/0081* (2013.01); *H03B 2200/004* (2013.01); *H03F 2200/294* (2013.01); *H03F 2200/451* (2013.01)

(58) Field of Classification Search
CPC ...... H04B 1/44; H03B 5/1228; H03B 5/1215; H03B 5/124; H01L 23/5226; H01L 23/5227; H01L 23/528; H01L 23/552; H01L 2924/0002; H01L 2924/00

See application file for complete search history.

(56) References Cited

U.S. PATENT DOCUMENTS

| | | | |
|---|---|---|---|
| 2004/0251978 A1 | 12/2004 | Muramatsu et al. | |
| 2011/0109396 A1* | 5/2011 | Tanabe ................... | H03B 5/124 331/117 FE |

(Continued)

FOREIGN PATENT DOCUMENTS

JP      2005-006153 A      1/2005

*Primary Examiner* — Thanh Le
(74) *Attorney, Agent, or Firm* — McDermott, Will & Emery LLP

(57) ABSTRACT

A semiconductor device and a communication circuit capable of reducing the effect of a noise generated in an inductor are provided. A semiconductor device according to an embodiment includes a substrate, a first circuit disposed in a first area of the substrate, a second circuit disposed in a second area of the substrate, the second circuit being configured to operate selectively with the first circuit, a first inductor disposed in the second area and connected to the first circuit, and a second inductor disposed in the first area and connected to the second circuit.

20 Claims, 19 Drawing Sheets

(51) Int. Cl.
*H01L 23/522* (2006.01)
*H03F 3/213* (2006.01)
*H04B 5/00* (2006.01)

(56) References Cited

U.S. PATENT DOCUMENTS

2014/0117496 A1* 5/2014 Cheng ................. H01L 23/5227
   257/531
2017/0222617 A1* 8/2017 Mizoguchi .......... H01L 23/5226

* cited by examiner

SEMICONDUCTOR DEVICE AND COMMUNICATION CIRCUIT

CROSS-REFERENCE TO RELATED APPLICATIONS

This application is based upon and claims the benefit of priority from Japanese patent application No. 2016-115317, filed on Jun. 9, 2016, the disclosure of which is incorporated herein in its entirety by reference.

BACKGROUND

The present invention relates to a semiconductor device and a communication circuit.

Japanese Unexamined Patent Application Publication No. 2005-6153 discloses a voltage-controlled oscillator including two spiral inductors. In the voltage-controlled oscillator disclosed in Japanese Unexamined Patent Application Publication No. 2005-6153, the spiral inductors are disposed on the surface of a substrate. Specifically, the spiral inductors are disposed on the uppermost wiring layer.

SUMMARY

However, the present inventors have found the following problem. In the voltage-controlled oscillator disclosed in Japanese Unexamined Patent Application Publication No. 2005-6153, a variable capacitor and a negative resistance part formed of a CMOS (Complementary metal-oxide-semiconductor) are disposed directly below the inductors. Therefore, there is a possibility that counter electromotive currents generated in the inductors could affect the negative resistance part as noises. In the case of high-speed and high-frequency circuits, in particular, the capacitive impedance is small. Therefore, there is a problem that noises propagate easily. As described above, there is a problem that the circuit configuration disclosed in Japanese Unexamined Patent Application Publication No. 2005-6153 is susceptible to the noises generated in the inductors.

Other objects and novel features will be more apparent from the following description in the specification and the accompanying drawings.

According to one embodiment, a semiconductor device includes: a first inductor; a second inductor; and a second circuit connected to the second inductor, the second circuit being disposed so as to be shifted from the first inductor in a plan view.

According to the above-described embodiment, it is possible to reduce the effect of noises generated in the inductors.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
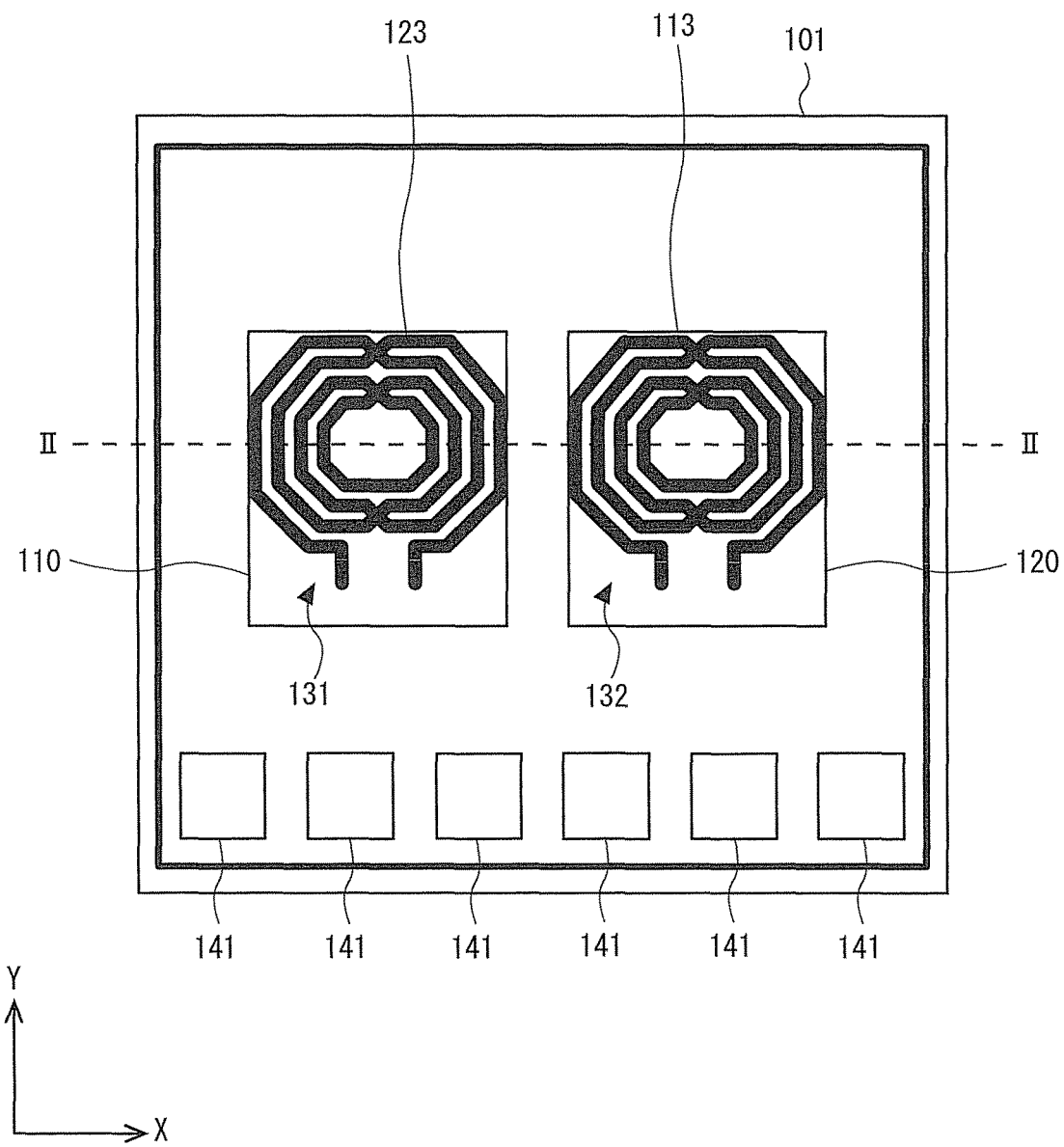
FIG. 1 is a plan view showing a configuration of a semiconductor device according to a first embodiment.

For clarifying the explanation, the following descriptions and the drawings may be partially omitted and simplified as appropriate. Further, each of the elements that are shown in the drawings as functional blocks for performing various processes can be implemented by hardware such as a CPU, a memory, and other types of circuits, or implemented by software such as a program loaded in a memory. Therefore, those skilled in the art will understand that these functional blocks can be implemented solely by hardware, solely by software, or a combination thereof. That is, they are limited to neither hardware nor software. Note that the same symbols are assigned to the same components throughout the drawings and duplicated explanations are omitted as required.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

First Embodiment (Configuration of Semiconductor Device)

Figure 2:
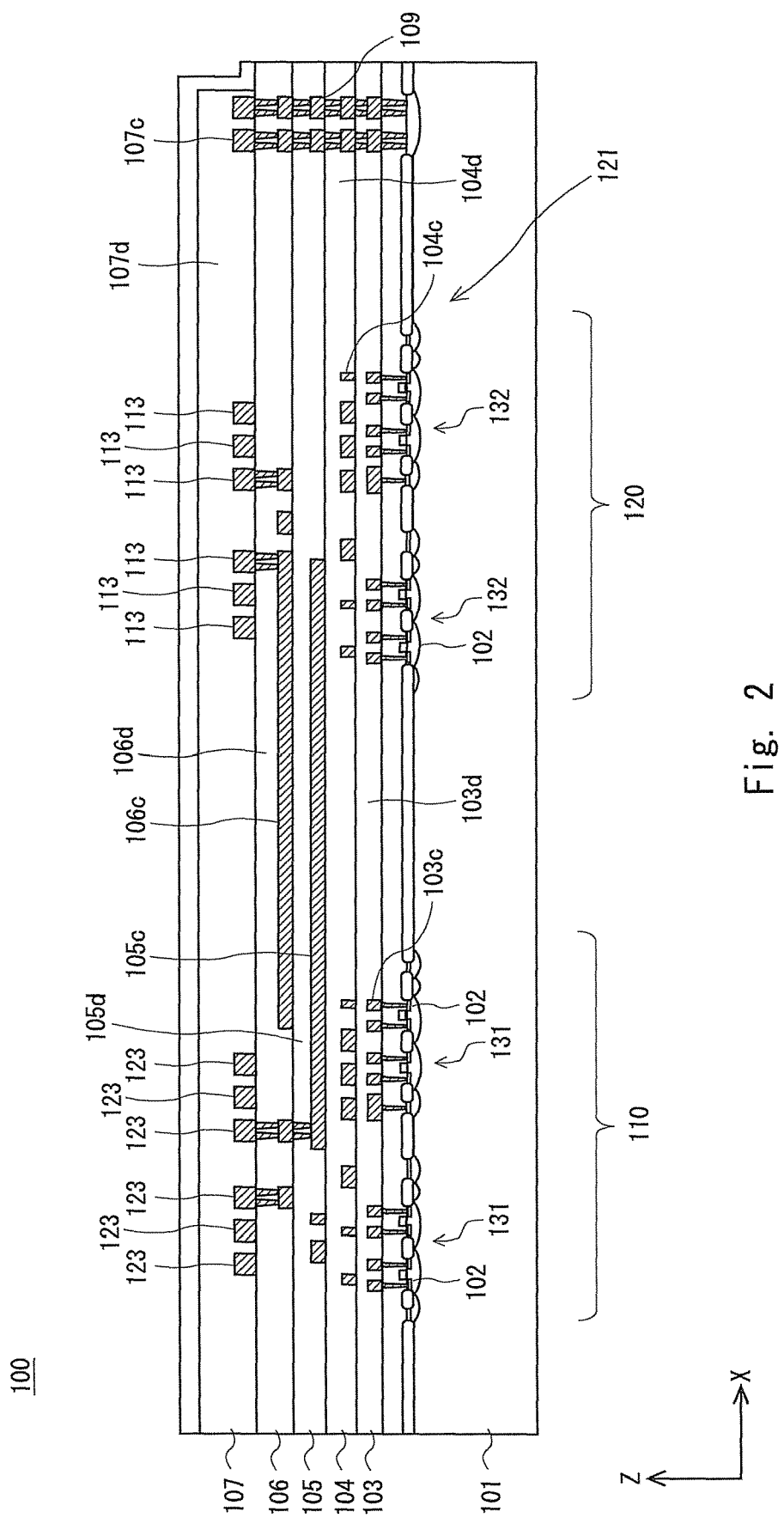
FIG. 2 is a cross section showing the configuration of the semiconductor device according to the first embodiment.

A configuration of a semiconductor device according to this embodiment is explained with reference to FIGS. 1 and 2. FIG. 1 is a plan view showing a configuration of a semiconductor device 100. FIG. 2 is a cross section taken along a line II-II in FIG. 1. As shown in FIGS. 1 and 2, the semiconductor device 100 includes a substrate 101, a first inductor 113, a second inductor 123, and terminals 141. Note that in FIG. 2, a direction perpendicular to the substrate 101 is defined as a Z-direction. The semiconductor device 100 is a semiconductor chip including a plurality of inductors. As shown in FIG. 1, a plane parallel to the substrate 101 is defined as an XY-plane. The X-, Y- and Z-directions are orthogonal to each other.

As shown in FIG. 1, the substrate 101 has a rectangular shape with sides extending in the X- and Y-direction. The substrate 101 is a semiconductor substrate such as a Si substrate. The substrate 101 includes a first area 110 and a second area 120. Each of the first and second areas 110 and 120 is a circuit formation area in which a semiconductor circuit such as a transistor is formed.

The first and second areas 110 and 120 are shifted (i.e., displaced) from each other in an XY-plane view (i.e., on the XY-plane). That is, the first and second areas 110 and 120 do not overlap each other in the XY-plane view. Although each of the first and second areas 110 and 120 has a rectangular shape, the shape of the first and second areas 110 and 120 on the XY-plane is not limited to any particular shape. The first and second areas 110 and 120 are arranged adjacent to each other in the X-direction.

The second inductor 123 is disposed in the first area 110. The second inductor 123 is connected to a second circuit 132 disposed in the second area 120. That is, an electric current is supplied to the second inductor 123 through the second circuit 132 disposed in the second area 120. In this way, the second inductor 123 operates. The first inductor 113 is disposed in the second area 120. The first inductor 113 is connected to a first circuit 131 disposed in the first area 110. That is, an electric current is supplied to the first inductor 113 through the first circuit 131 disposed in the first area 110. In this way, the first inductor 113 is operated. Each of the first and second inductors 113 and 123 is formed by a wiring pattern that is spirally wound in the XY-plane view.

The terminals 141 are disposed in an end part of the substrate 101 that is located on the negative side in the Y-direction. In FIG. 1, six terminals are arranged in the X-direction. The terminals 141 are input/output terminals for receiving/outputting signals from/to the first and second circuits. Further, electric currents that flow through the first and second inductors 113 and 123 may be supplied through the terminals 141.

The first and second circuits 131 and 132 are disposed above the substrate 101. The first circuit 131 is formed within the first area 110. The second circuit 132 is formed within the second area 120. Each of the first and second circuits 131 and 132 is a semiconductor circuit including CMOS transistors 102 and capacitors (which are not shown in FIG. 2).

Further, a plurality of wiring layers 103 to 107 are formed above the CMOS transistors 102. They connect components of the first circuit 131. Similarly, the plurality of wiring layers 103 to 107 connect components of the second circuit 132.

Although five wiring layers 103 to 107 are disposed above the CMOS transistors 102 in FIG. 2, the number of wiring layers is not limited to any particular number. The wiring layers 103 to 107 include wiring lines and inter-layer insulating films formed so as to cover the wiring lines. For example, the wiring layer 103 includes wiring lines 103c and an inter-layer insulating film 103d. Further, the inter-layer insulating film 103d covers the wiring lines 103c. Similarly, the wiring layers 104 to 107 include wiring lines 104c to 107c, respectively, and inter-layer insulating films 104d to 107d, respectively. Further, the wiring layers 103c to 107c are connected to one another through vias (i.e., through-holes) 109. That is, the semiconductor device 100 includes the vias 109 for connecting the wiring layers 103c to 107c with one another.

The second inductor 123 and the first inductor 113 are mainly formed by the wiring layer 107, which is the uppermost wiring layer. Further, the second inductor 123 is connected to the second circuit 132 through a wiring line 105c that is formed so as to extend from the first area 110 to the second area 120. The first inductor 113 is connected to the first circuit 131 through a wiring line 106c that is formed so as to extend from the second area 120 to the first area 110. Note that although the wiring lines 105c and 106c extending from the first area 110 to the second area 120 are disposed in the wiring layers 105 and 106, respectively, they may be disposed in any of the wiring layers 103 to 107. Further, wiring lines disposed between the first and second areas 110 and 120 may be formed over two or more wiring layers.

As described above, in the XY-plane view, the first circuit 131 and the second inductor 123 overlap each other and the second circuit 132 and first inductor 113 overlap each other. In other words, in the XY-plane view, the second inductor 123 and the second circuit 132 do not overlap each other and the first inductor 113 and first circuit 131 do not overlap each other.

Note that the first and second circuits 131 and 132 operate in a selective manner. The second circuit 132 operates when the first circuit 131 is not in operation. Further, the first circuit 131 operates when the second circuit 132 is not in operation. In other words, the first and second circuits 131 and 132 do not simultaneously operate.

The first circuit 131 is connected to the first inductor 113. The second circuit 132 is connected to the second inductor 123. Therefore, an electric current is supplied to the first inductor 113 when the first circuit 131 is in operation. An electric current is supplied to the second inductor 123 when the second circuit 132 is in operation. In other words, no electric current is supplied to the second inductor 123 when the first circuit 131 is in operation. No electric current is supplied to the first inductor 113 when the second circuit 132 is in operation.

The first circuit 131 is disposed directly below the second inductor 123 and disposed so as to be shifted from the first inductor 113 in the XY-plane view. The second inductor 123 is located closer to the first circuit 131 than the first inductor 113 is. Note that when the first circuit 131 is in operation, an electric current is supplied to the first inductor 113, while no electric current is supplied to the second inductor 123.

According to the above-described semiconductor device, when the first circuit 131 is in operation, no counter electromotive current is generated in the second inductor 123. Therefore, the second inductor 123 does not cause any noise affecting the first circuit 131. When the first circuit 131 is in operation, a counter electromotive current is generated in the second inductor 123. However, the first circuit 131 is disposed so as to be shifted from the first inductor 113 in the XY-plane view. Therefore, even when the first inductor 113 causes noises, they hardly affect the first circuit 131. Consequently, it is possible to decrease the effect of noises caused by the inductor.

Similarly, according to the above-described semiconductor device, the second circuit 132 is disposed directly below the first inductor 113 and disposed so as to be shifted from the second inductor 123 in the XY-plane view. The first inductor 113 is located closer to the second circuit 132 than the second inductor 123 is. Note that when the second circuit 132 is in operation, an electric current is supplied to the second inductor 123, while no electric current is supplied to the first inductor 113.

When the second circuit 132 is in operation, no counter electromotive current is generated in the first inductor 113. Therefore, the first inductor 113 does not cause any noise affecting the second circuit 132. When the second circuit 132 is in operation, a counter electromotive current is generated in the first inductor 113. However, the second circuit 132 is disposed so as to be shifted from the second inductor 123 in the XY-plane view. Therefore, even when the second inductor 123 causes noises, they hardly affect the second circuit 132. Consequently, it is possible to decrease the effect of noises caused by the inductor.

As described above, the first circuit 131 and the first inductor 113, which simultaneously operate, do not overlap each other in the XY-plane view. Therefore, it is possible to decrease the effect of noises on the first circuit 131 caused by the first inductor 113. Similarly, the second circuit 132 and the second inductor 123, which simultaneously operate, do not overlap each other in the XY-plane view. Therefore, it is possible to decrease the effect of noises on the second circuit 132 caused by the second inductor 123.

Meanwhile, in the XY-plane view, the first circuit 131 and the second inductor 123, which do not simultaneously operate, overlap each other. Further, in the XY-plane view, the second circuit 132 and the first inductor 113, which do not simultaneously operate, overlap each other. As a result, it is possible to prevent or reduce an increase in circuit size. That is, since it is very difficult to reduce the sizes of the first and second inductors 113 and 123, the first and second inductors 113 and 123 occupy a large area in the semiconductor circuit. However, the second circuit 132 can be placed above or below the first inductor 113 and the first circuit 131 can be placed above or below the second inductor 123.

As a result, according to the above-described semiconductor device, it is possible to effectively use the areas located directly below the first and second inductors 113 and 123 and thereby to prevent or reduce an increase in circuit size. Since other circuits can be disposed directly below the first and second inductors 113 and 123, the chip size can be reduced.

Further, the semiconductor device 100 includes the substrate 101, the first inductor 113 formed above the substrate 101, and the second inductor 123 formed above the substrate 101, in which the second inductor 123 is disposed so as to be shifted from the first inductor 113 in a plan view. Further, the semiconductor device 100 includes the first circuit 131, which is disposed so as to overlap the second inductor 123 in the plan view and configured to operate when the second inductor 123 is not in operation. The semiconductor device 100 includes the second circuit 132, which is disposed so as to overlap the first inductor 113 in the plan view and configured to operate when the first inductor 113 is not in operation.

According to the above-described semiconductor device, by the above-described configuration, it is possible to decrease the effect of noises resulting from a counter electromotive current caused by the inductors. Therefore, other circuits (i.e., the first and second circuits 131 and 132) can be disposed below the first and second inductors 113 and 123 on the semiconductor chip, thus enabling the chip size to be reduced.

Application Example of Semiconductor Device 100

Figure 3:
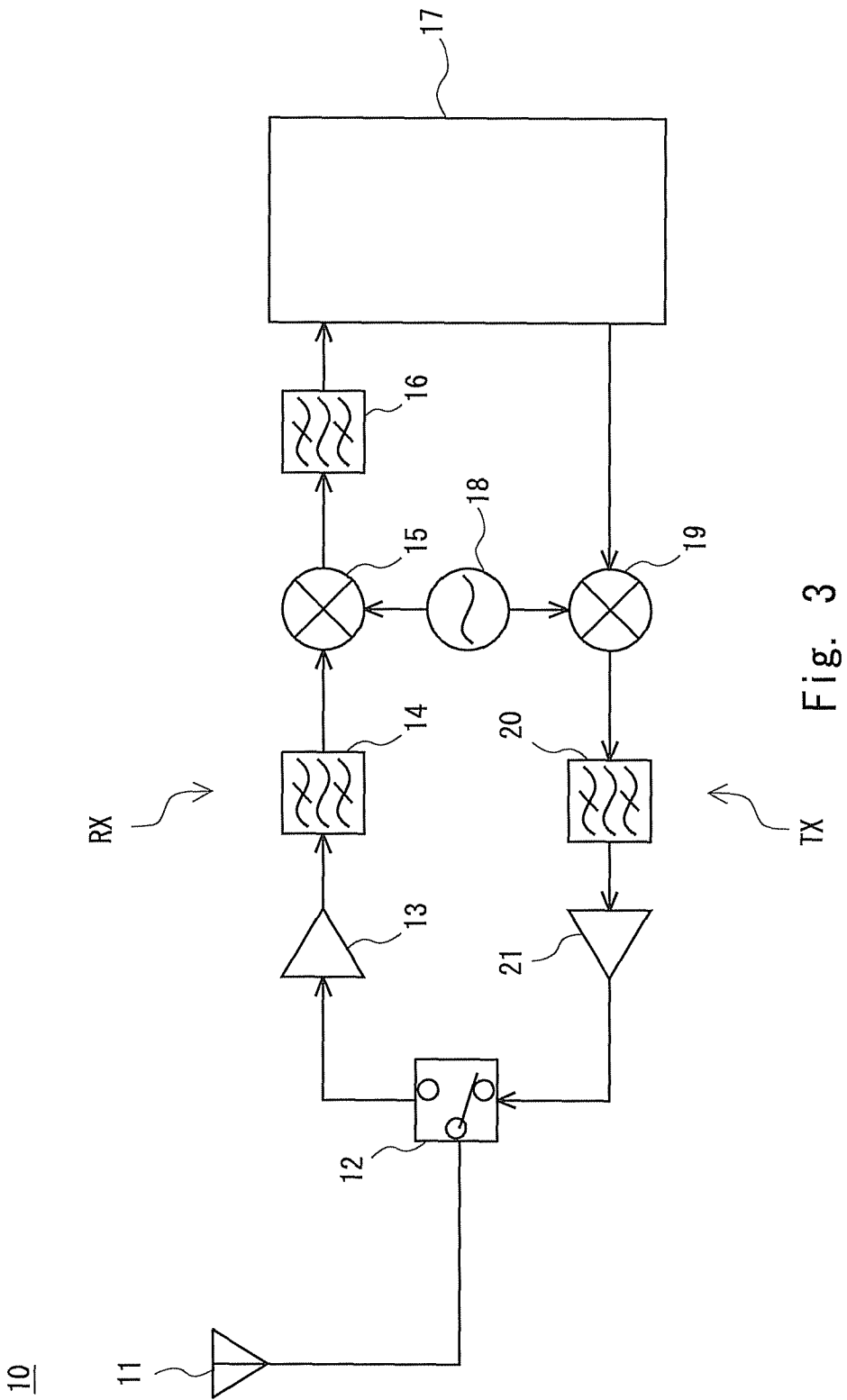
FIG. 3 shows a configuration of a communication circuit with a semiconductor device according to an embodiment disposed therein.

Next, a communication circuit to which the semiconductor device 100 is applied is explained with reference to FIG. 3. FIG. 3 shows a configuration of a communication circuit 10 with the semiconductor device 100 disposed therein. The communication circuit 10 is a circuit for performing radio communication with other devices. Therefore, the communication circuit 10 includes a receiving circuit RX for performing a receiving process and a transmitting circuit TX for performing a transmitting process. More specifically, the communication circuit 10 includes an antenna 11, a switch 12, an LNA (Low Noise Amplifier) 13, a filter 14, a mixer 15, an I/F filter 16, a baseband circuit 17, an oscillator 18, a mixer 19, a filter 20, and a PA (Power Amplifier) 21.

The receiving circuit RX includes the antenna 11, the switch 12, the LNA (Low Noise Amplifier) 13, the filter 14, the mixer 15, the I/F filter 16, the baseband circuit 17, and the oscillator 18. The transmitting circuit TX includes the baseband circuit 17, the oscillator 18, the mixer 19, the filter 20, the PA (Power Amplifier) 21, the switch 12, and the antenna 11. Note that the antenna 11, the switch 12, the baseband circuit 17, and the oscillator 18 are shared by the transmitting circuit TX and the receiving circuit RX.

The antenna 11 receives a radio wave from space (i.e., from surrounding space) as a radio frequency (i.e., high frequency) signal and transmits a radio wave to space as a radio frequency signal. The switch 12 switches a path of a radio frequency signal according to whether the signal is transmitted or received. That is, in a receiving operation, the switch 12 connects the antenna 11 with the LNA 13. Further, in a transmitting operation, the switch 12 connects the antenna 11 with the PA 21.

Firstly, the receiving circuit RX is explained hereinafter. A radio frequency signal is input to the LNA 13 as a reception signal through the antenna 11 and the switch 12. The LNA 13 is a reception amplifier circuit that amplifies a reception signal. The LNA 13 outputs the reception signal to the filter 14. The filter 14 removes unnecessary band components (i.e., unnecessary frequency components) included in the reception signal. Then, the reception signal output from the filter 14 is input to the mixer 15.

The oscillator 18 generates a local signal having a predetermined frequency. The oscillator 18 outputs the local signal to the mixer 15. The mixer 15 demodulates the reception signal by using the local signal. The reception signal demodulated by the mixer 15 is input to the baseband circuit 17 through the I/F filter 16. The baseband circuit 17 includes an A/D converter, a baseband processor, and so on. The baseband circuit 17 generates reception data based on the reception signal. For example, the baseband circuit 17 generates reception data by performing a baseband process for the reception signal. In this way, the receiving circuit RX performs a receiving process.

Next, the transmitting circuit TX is explained. The baseband circuit 17 includes a D/A convertor and the like, and generates a transmission signal, which is a baseband signal, based on transmission data. The baseband circuit 17 outputs the transmission signal to the mixer 19. Further, the oscillator 18 outputs a local signal to the mixer 19. The mixer 19 modulates the transmission signal by using the local signal. The mixer 19 outputs the modulated transmission signal to the filter 20. The filter 20 removes unnecessary band components (i.e., unnecessary frequency components) included in the transmission signal. The filter 20 outputs the transmission signal to the PA 21. The PA 21 is a transmission amplifier circuit that amplifies the transmission signal. The PA 21 outputs the transmission signal to the antenna 11 through the switch 12. In this way, the transmitting circuit TX performs a transmitting process.

In the communication circuit 10, the transmitting process and the receiving process are performed in an alternative manner. That is, the transmitting process and the receiving process are not simultaneously performed. Therefore, the switch 12 changes the component to which the antenna 11 is connected. When a transmitting process is performed, the switch 12 switches the signal path to the transmitting circuit side. When a receiving process is performed, the switch 12 switches the signal path to the receiving circuit RX side.

Therefore, the LNA 13 of the receiving circuit RX and the PA 21 of the transmitting circuit TX are circuits that operate in a selective manner. Therefore, in the semiconductor device 100 shown in FIGS. 1 and 2, the LNA 13 may include the first circuit 131 and the first inductor 113, and the PA 21 may include the second circuit 132 and the second inductor 123. In this way, the effect of noises can be reduced. Further, a circuit element (s) of the transmitting circuit TX can be disposed directly below the first inductor 113 and a circuit element (s) of the receiving circuit RX can be disposed directly below the second inductor 123. Therefore, it is possible to prevent or reduce an increase in circuit size and thereby to reduce the chip size. Note that examples of the circuit element that is placed above or below the first inductor 113 or the second inductor 123 include a MOS transistor and a capacitor.

Figure 4:
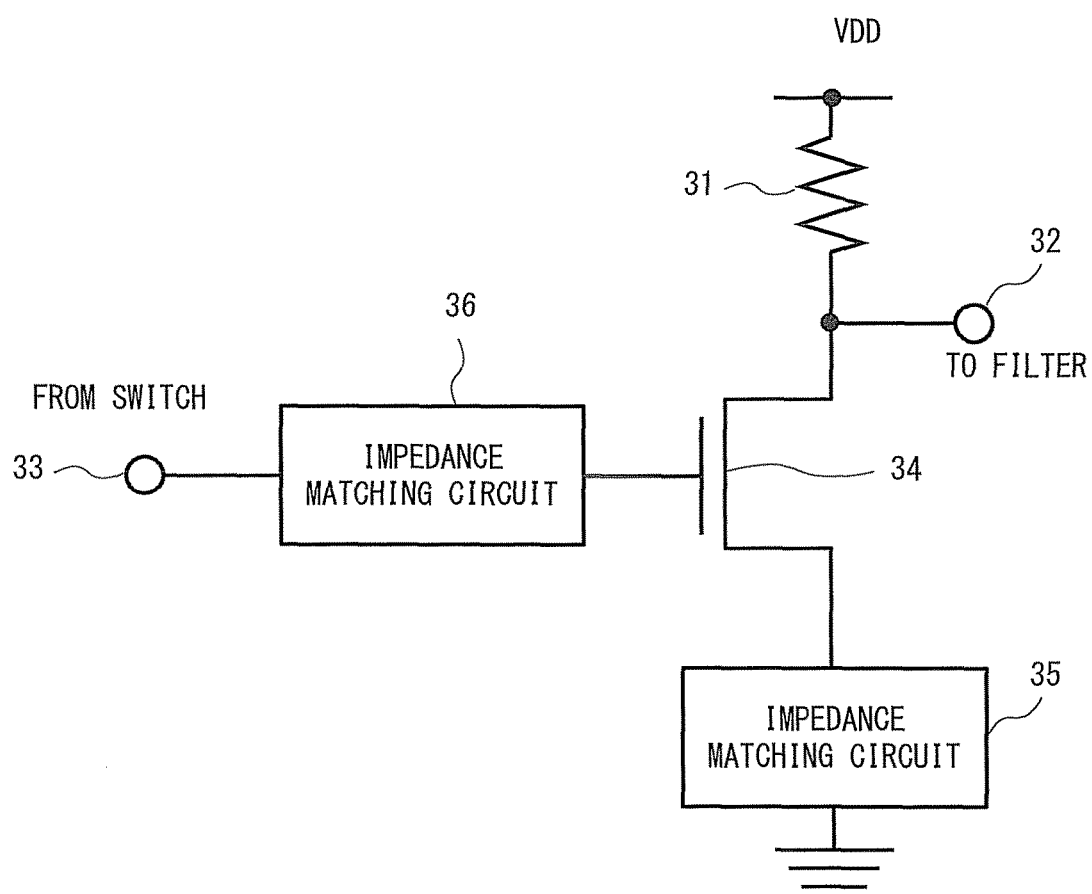
FIG. 4 is a circuit diagram showing an example of an LNA including a semiconductor device.

An example of a circuit configuration of the LNA 13 is explained with reference to FIG. 4. FIG. 4 is a circuit diagram in which the configuration of the LNA 13 is shown in a simplified manner. As shown in FIG. 4, the LNA 13 includes a resistance 31, an output terminal 32, an input terminal 33, a transistor 34, an impedance matching circuit 35, and an impedance matching circuit 36. Note that the configuration of the LNA 13 shown in FIG. 4 is simplified as appropriate for clarifying the explanation. Therefore, components other than those shown in FIG. 4 may be added in the LNA 13.

The resistance 31, the transistor 34, and the impedance matching circuit 35 are connected in series between a power supply voltage VDD and a ground (GND). In this example, the resistance 31 is disposed on the power supply voltage VDD side and the impedance matching circuit 35 is disposed on the ground side. The transistor 34 is disposed between the impedance matching circuit 35 and the resistance 31.

A node between the transistor 34 and the resistance 31 is connected to the output terminal 32. The output terminal 32 is connected to the filter 14 shown in FIG. 3. A gate terminal of the transistor 34 is connected to the input terminal 33 through the impedance matching circuit 36. The input terminal 33 is connected to the switch 12.

Each of the impedance matching circuits 35 and 36 is a circuit that includes an inductor, a capacitor, and so on to obtain impedance matching. The inductor included in the impedance matching circuit 35 or 36 is regarded as the first inductor 113.

Figure 5:
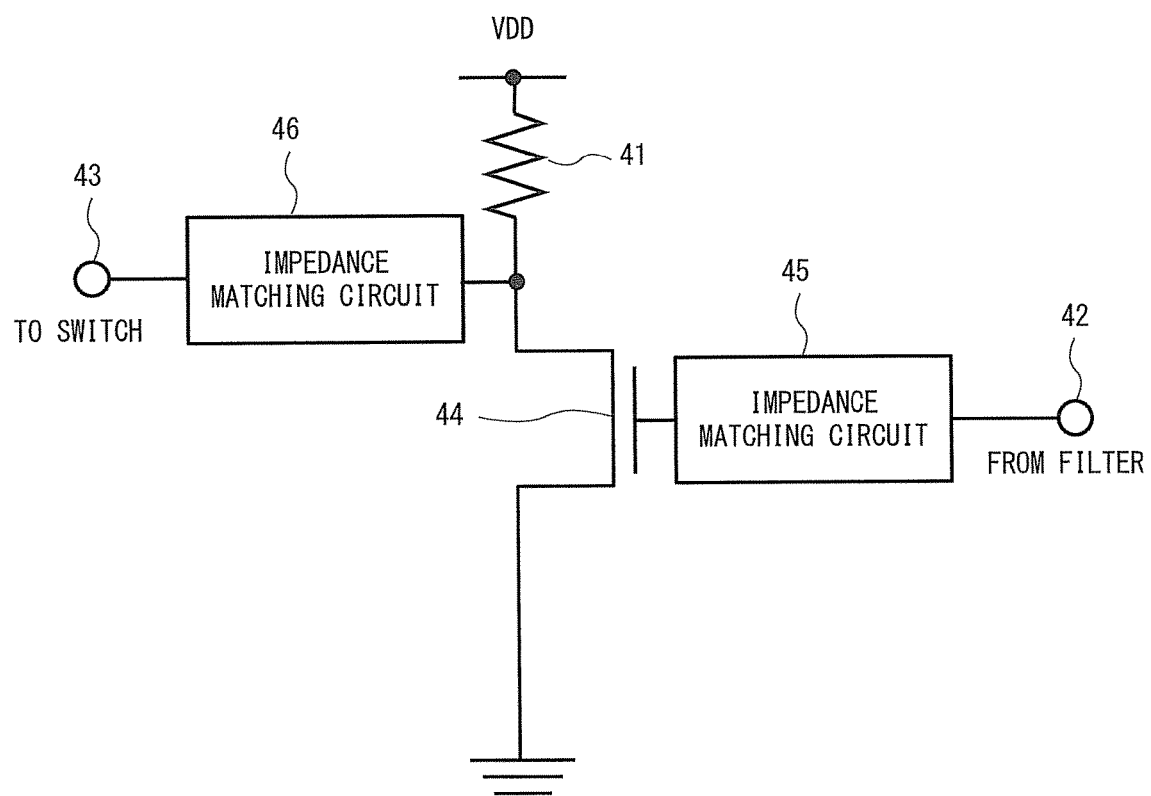
FIG. 5 is a circuit diagram showing an example of a PA including a semiconductor device.

Next, an example of a circuit configuration of the PA 21 is explained with reference to FIG. 5. FIG. 5 is a circuit diagram showing an example of the PA 21. The PA 21 includes a resistance 41, an input terminal 42, an output terminal 43, a transistor 44, an impedance matching circuit 45, and an impedance matching circuit 46. Note that the configuration of the PA 21 shown in FIG. 5 is simplified as appropriate for clarifying the explanation. Therefore, components other than those shown in FIG. 5 may be added in the PA 21.

The resistance 41 and the transistor 44 are connected in series between a power supply voltage VDD and a ground. The resistance 41 is disposed on the power supply voltage VDD side and the transistor 44 is disposed on the ground side. A gate of the transistor 44 is connected to the input terminal 42 through the impedance matching circuit 45. The input terminal 42 is connected to the filter 20 shown in FIG. 3. A node between the resistance 41 and the transistor 44 is connected to the output terminal 43 through the impedance matching circuit 46. The output terminal 43 is connected to the switch 12 shown in FIG. 3.

Each of the impedance matching circuits 45 and 46 is a circuit that includes an inductor and a capacitor to obtain impedance matching. The inductor included in the impedance matching circuit 45 or 46 is regarded as the second inductor 123.

Therefore, the second inductor 123 included in the impedance matching circuit 45 or 46 is disposed so as to overlap the LNA 13, which is regarded as the first circuit 131. Specifically, the second inductor 123 included in the impedance matching circuit 45 or 46 is disposed so as to overlap the transistor 34 or the resistance 31.

Similarly, the first inductor 113 is disposed so as to overlap the PA 21, which is regarded as the second circuit 132. Specifically, the first inductor 113 included in the impedance matching circuit 35 or 36 is disposed so as to overlap the transistor 44 or the resistance 41.

The second circuit 132, which overlap the first inductor 113, is not limited to the PA 21. That is, the second circuit 132, which overlap the first inductor 113, may be a part of or the whole of the transmitting circuit TX. For example, a part of (or some of) the mixer 19, the filter 20, and the PA 21 can be the second circuit 132.

Similarly, the first circuit 131 included in the impedance matching circuit 45 or 46, which overlap the second inductor 123, is not limited to the LNA 13. That is, the first circuit 131, which overlap the second inductor 123, may be a part of or the whole of the receiving circuit RX. For example, a part of (or some of) the LNA 13, the filter 14, the mixer 15, and the I/F filter 16 can be the first circuit 131.

Further, the first inductor 113 is not limited to the component included in the LNA 13 and may be a component included in the filter 14, the mixer 15, or the I/F filter 16. Similarly, the second inductor 123 is not limited to the component included in the PA 21 and may be a component included in the mixer 19 or the filter 20.

As described above, the communication circuit 10 with the semiconductor device according to this embodiment disposed therein includes the transmitting circuit TX and the receiving circuit RX that operate in a selective manner. Therefore, the communication circuit 10 has a circuit configuration in which the first inductor 113 included in the receiving circuit RX overlaps a part of the transmitting circuit TX (e.g., a CMOS transistor and/or a capacitor) and the second inductor 123 included in the transmitting circuit TX overlaps a circuit included in the receiving circuit RX (e.g., a CMOS transistor and/or a capacitor). As a result, the effect of noises caused by the inductors can be reduced.

For example, when the receiving circuit RX is in operation, the transmitting circuit TX, which overlaps the first inductor 113, does not operate. Therefore, even if a counter electromotive current is generated in the first inductor 113, it does not affect the transmitting circuit TX. Further, the circuit of the receiving circuit RX other than the first inductor 113 is disposed away from the first inductor 113. Therefore, noises resulting from the counter electromotive current generated in the first inductor 113 hardly affect the receiving circuit RX.

Further, when the transmitting circuit TX is in operation, the receiving circuit RX, which overlaps the second inductor 123, does not operate. Therefore, even if a counter electromotive current is generated in the second inductor 123, it does not affect the receiving circuit RX. Further, the circuit of the transmitting circuit TX other than the second inductor 123 is disposed away from the second inductor 123. Therefore, noises resulting from the counter electromotive current generated in the second inductor 123 hardly affect the transmitting circuit TX. Accordingly, the effect of noises can be reduced in both of the transmitting process and the receiving process.

Second Embodiment

Figure 6:
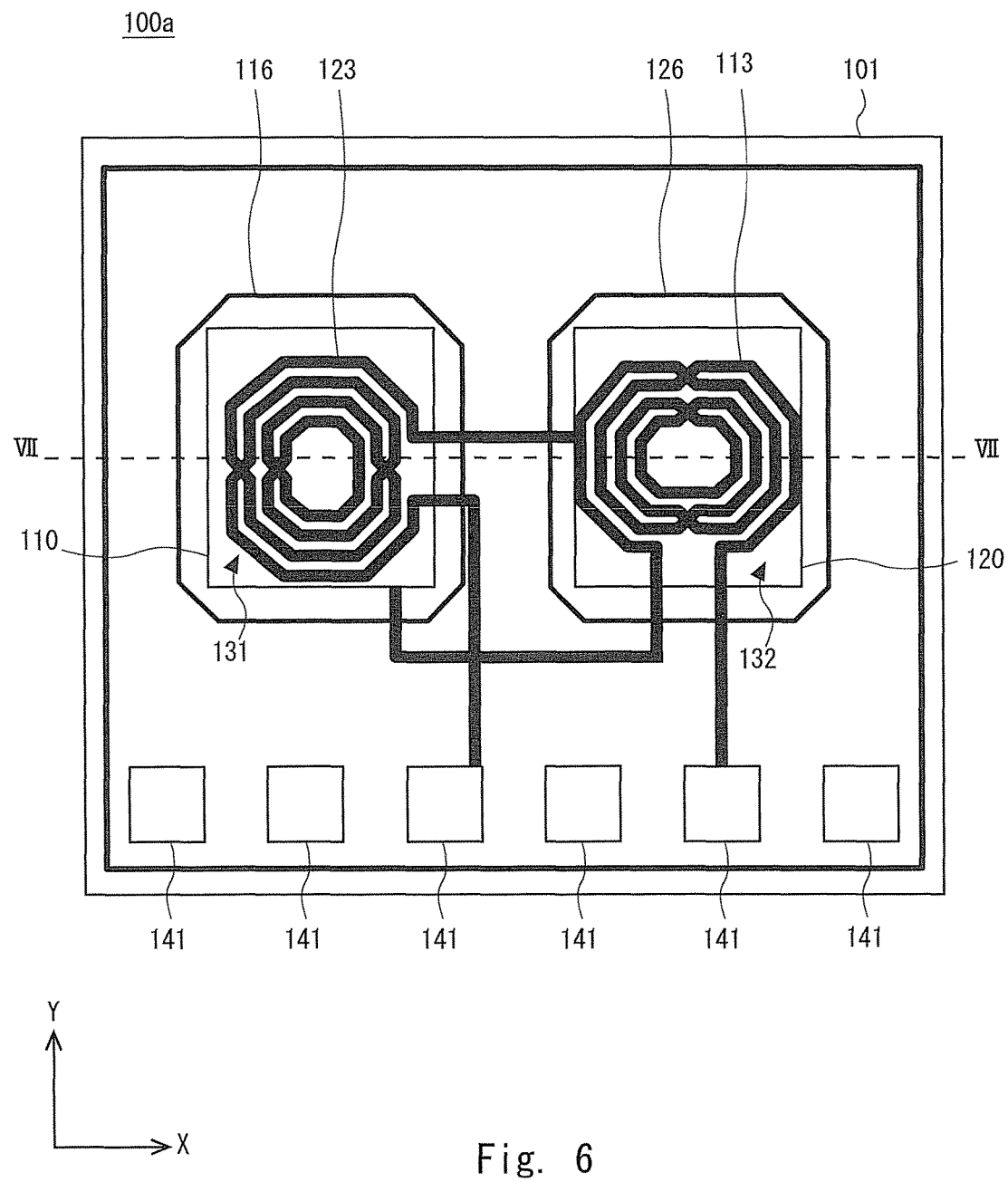
FIG. 6 is a plan view showing a configuration of a semiconductor device according to a second embodiment.
Figure 7:
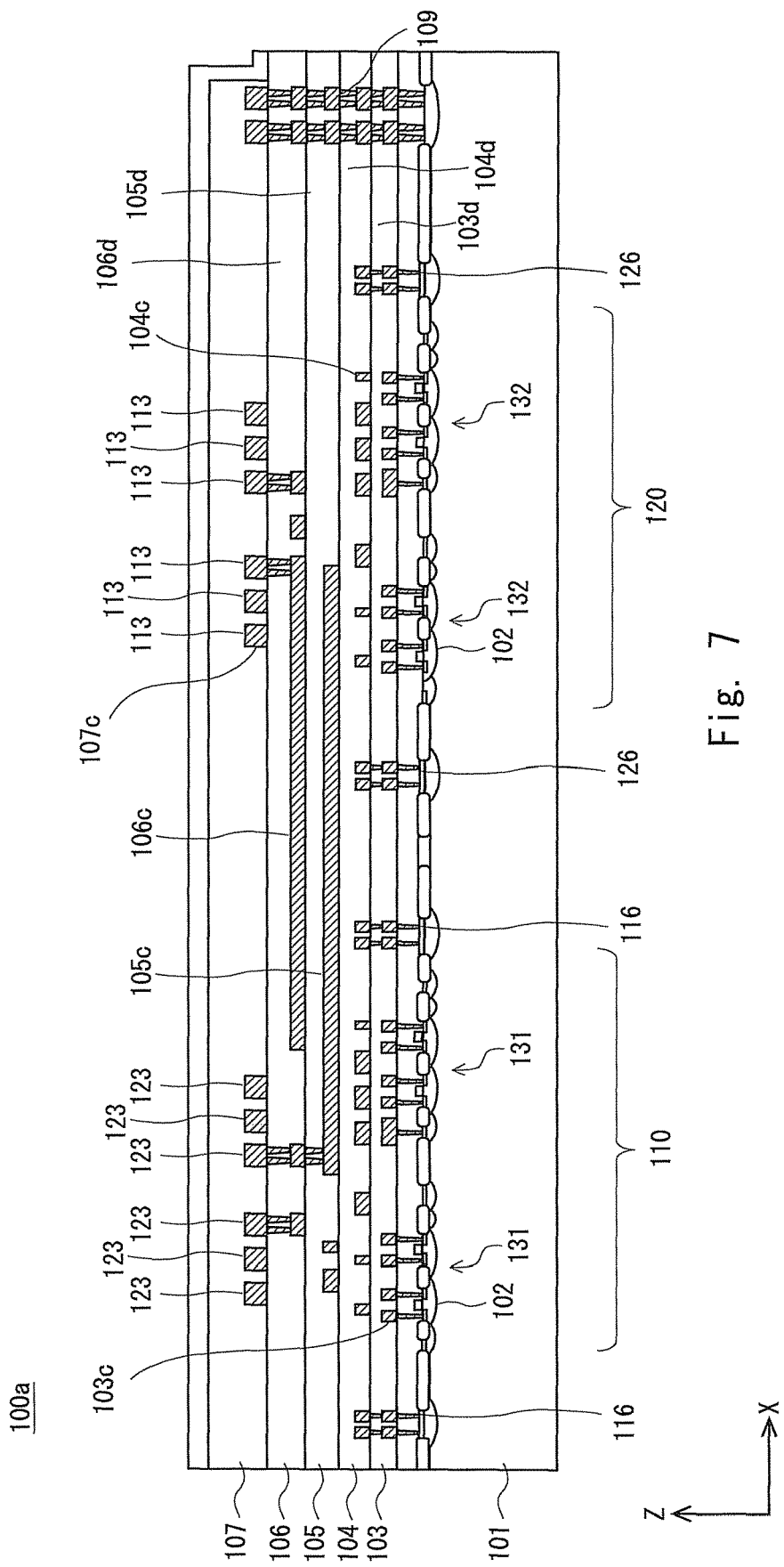
FIG. 7 is a cross section showing the configuration of the semiconductor device according to the second embodiment.

A configuration of a semiconductor device 100a according to a second embodiment is explained with reference to FIGS. 6 and 7. FIG. 6 is a plan view showing a configuration of the semiconductor device 100a and FIG. 7 is a cross section taken along a line VII-VII in FIG. 6. The semiconductor device 100a according to this embodiment includes a first guard ring 116 and a second guard ring 126 in addition to the components of the semiconductor device 100 according to the first embodiment. Note that the configuration of the semiconductor device 100a other than the first and second guard rings 116 and 126 is similar to that of the semiconductor device 100 and hence its explanation is omitted as appropriate.

The first guard ring 116 is disposed around the second inductor 123. The first guard ring 116 is formed so as to surround the second inductor 123. The second guard ring 126 is disposed around the first inductor 113. The second guard ring 126 is formed so as to surround the first inductor 113. The first and second guard rings 116 and 126 are formed by the wiring layers 103 and 104. Note that the wiring layers by which the first and second guard rings 116 and 126 are formed are not limited to any particular wiring layer.

The first guard ring 116 is disposed outside the first area 110 so as to surround the first circuit 131. The second guard ring 126 is disposed outside the second area 120 so as to surround the second circuit 132. One end of the first inductor 113 is connected to the first circuit 131 and the other end thereof is connected to a terminal 141. One end of the second inductor 123 is connected to the second circuit 132 and the other end thereof is connected to a terminal 141. A fixed potential is supplied to the first and second guard rings 116 and 126 through terminals 141. Therefore, the potential of the substrate 101 can be fixed in the semiconductor device according to this embodiment.

Further, the potential of the first and second guard rings 116 and 126 is fixed to a fixed potential such as a ground potential or a power supply potential. The second guard ring 126 is used as a power supply line or a ground line for the second circuit 132, which is located directly below the first inductor 113. The first guard ring 116 is used as a power supply line or a ground line for the first circuit 131, which is located directly below the second inductor 123. By fixing the potential of the first and second guard rings 116 and 126, variations in the characteristics of the inductors can be reduced. Therefore, the semiconductor device according to this embodiment can reduce the propagation of noises by using the first and second guard rings 116 and 126.

Further, when the first and second guard rings 116 and 126 are used as a ground line, the first and second guard rings 116 and 126 are connected to a P-type diffusion layer. When the first and second guard rings 116 and 126 are used as a power supply line, the first and second guard rings 116 and 126 are connected to an N-type diffusion layer. In this way, they prevent the formation of a leak path to the substrate 101. Further, by connecting the first and second guard rings 116 and 126 to the N-type diffusion layer, it is possible to prevent the propagation of noises by a depletion layer formed by the substrate 101 and a P-well. The first area 110 and the second area 120 do not necessarily have to be located completely inside the second inductor 123 and the first inductor 113, respectively. That is, parts of the first circuit 131 and the second circuit 132 may be disposed outside the second inductor 123 and the first inductor 113, respectively.

Further, similar to the semiconductor device 100, the semiconductor device 100a according to this embodiment may be installed in a communication circuit 10. That is, the LNA 13 may be formed by the first circuit 131 and the first inductor 113, and the PA 21 may be formed by the second circuit 132 and the second inductor 123.

Third Embodiment

Figure 8:
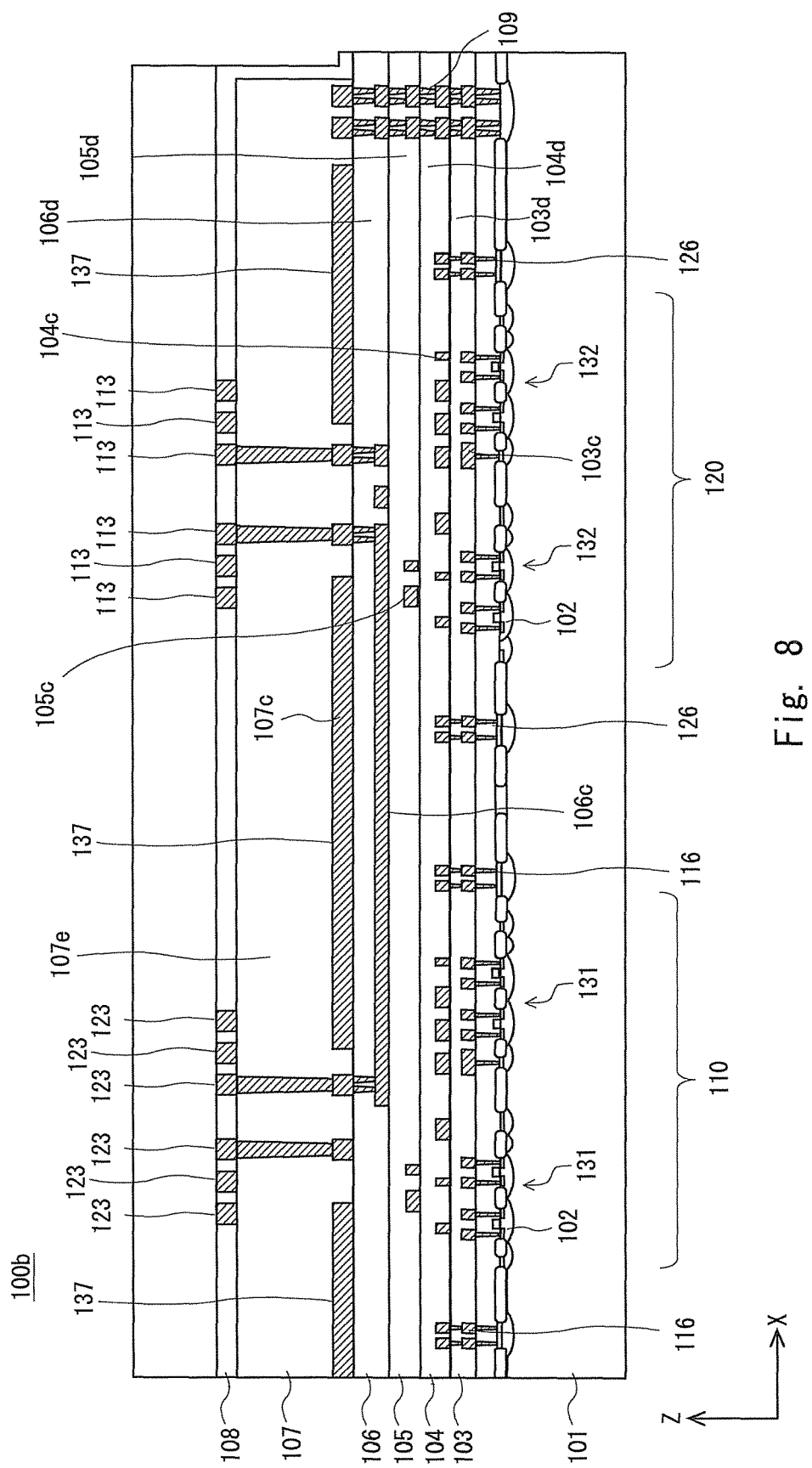
FIG. 8 is a cross section showing a configuration of a semiconductor device according to a third embodiment.

A configuration of a semiconductor device 100b according to this embodiment is explained with reference to FIG. 8. The semiconductor device 100b includes a shield pattern in addition to the components of the semiconductor device 100a. Note that the fundamental configuration of the semiconductor device 100b is similar to those of the semiconductor devices 100 and 100a and hence its explanation is omitted as appropriate.

First and second circuits 131 and 132 include wiring layers 103 to 107. The wiring layer 107 includes a wiring line 107c and a passivation layer 107e covering the wiring line 107c. The passivation layer 107e is formed by an insulating layer that is sufficiently thicker than each of the wiring layers 103 to 106. For example, the passivation layer 107e is formed by a resin film such as a polyimide film. A shield pattern 137 is formed by the wiring line 107c.

A wiring layer 108 is formed above the wiring layer 107. The wiring layer 108 is the uppermost wiring layer. First and second inductors 113 and 123 are formed by the uppermost wiring layer 108. Therefore, in the Z-direction, no wiring layer is disposed between the first inductor 113 and the wiring line 107c of the shield pattern 137. In the Z-direction, no wiring layer is disposed between the second inductor 123 and the wiring line 107c of the shield pattern 137.

The shield pattern 137 is formed by the wiring line 107c of the wiring layer 107. A fixed potential such as a ground potential or a power supply potential is supplied to the shield pattern 137. Since the passivation layer 107e is sufficiently think, the capacitive effect is small even when the shield pattern is formed by the uppermost wiring layer 107. Therefore, it is expected that the Q-value will rise without deteriorating the self-resonant frequencies of the first and second inductors 113 and 123. Further, since the potential of the shield pattern 137 is fixed, the shield pattern 137 can be used as a ground line or a power supply line for peripheral circuits.

Figure 9:
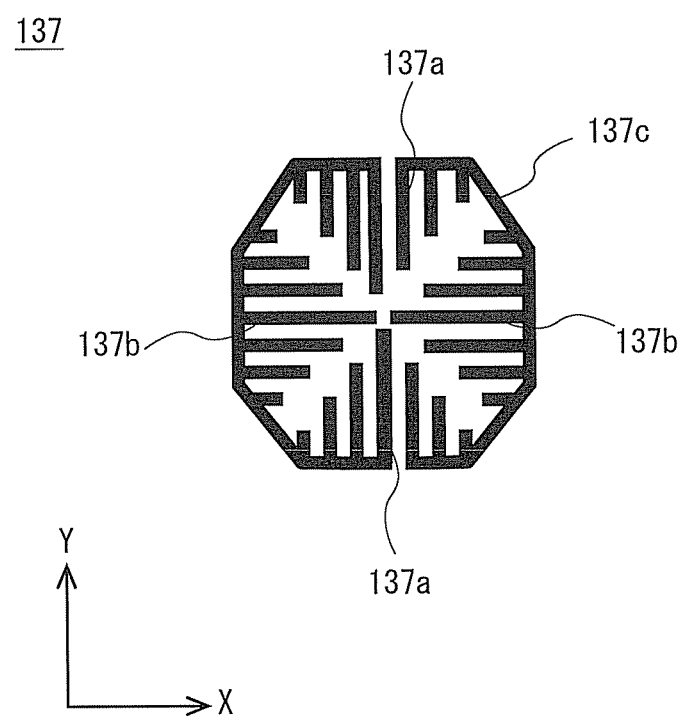
FIG. 9 is a plan view showing an example of a shield pattern of a semiconductor device.
Figure 10:
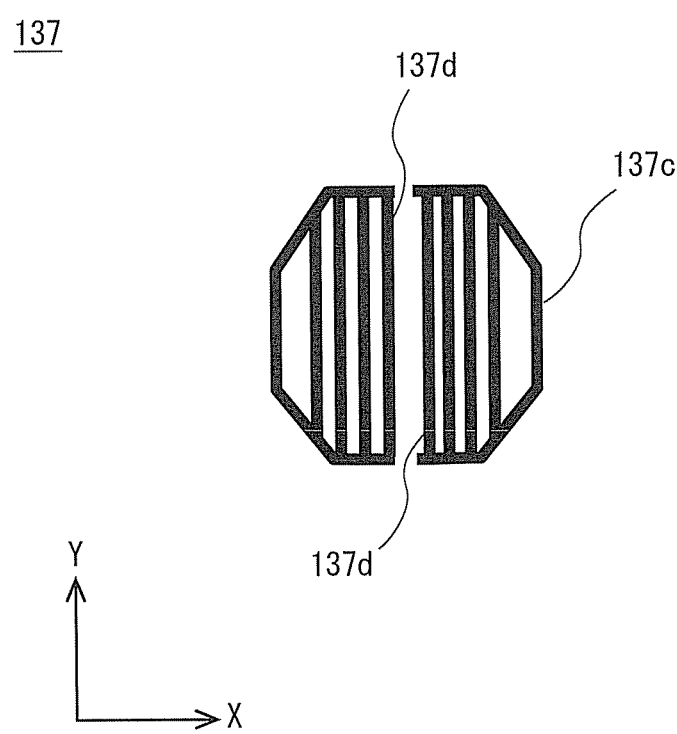
FIG. 10 is a plan view showing an example of a shield pattern of a semiconductor device.

In the XY-plane view, the shield pattern 137 is disposed so as to sever eddy currents generated by the first and second inductors 113 and 123. As a result, the semiconductor device according to this embodiment can reduce the effect of noises even further. Each of FIGS. 9 and 10 shows a preferred example of an arrangement of the shield pattern 137. Each of FIGS. 9 and 10 is a plan view schematically showing a configuration of the shield pattern 137.

In FIG. 9, the shield pattern 137 includes a plurality of lengthwise patterns (i.e., a plurality of lengthwise stripes) 137a, a plurality of crosswise patterns (i.e., a plurality of crosswise stripes) 137b, and an outer circumference pattern 137c. Each of the lengthwise patterns 137a extends in the Y-direction. Each of the crosswise patterns 137b extends in the X-direction. The lengthwise patterns 137a and the crosswise patterns 137b are arranged so as to sever an eddy current. Further, the outer circumference pattern 137c connects the plurality of lengthwise patterns 137a and the plurality of crosswise patterns 137b with one another. In this way, the shield pattern 137 can be connected to the ground.

In FIG. 10, the shield pattern 137 includes a plurality of slit patterns (i.e., a plurality of stripes) 137d and an outer circumference pattern 137c. The plurality of slit patterns 137d extend in the Y-direction. The slit patterns 137d is arranged so as to traverse an eddy current. The plurality of slit patterns 137d are connected to one another by the outer circumference pattern 137c. In this way, the shield pattern 137 can be connected to the ground.

Fourth Embodiment

Figure 11:
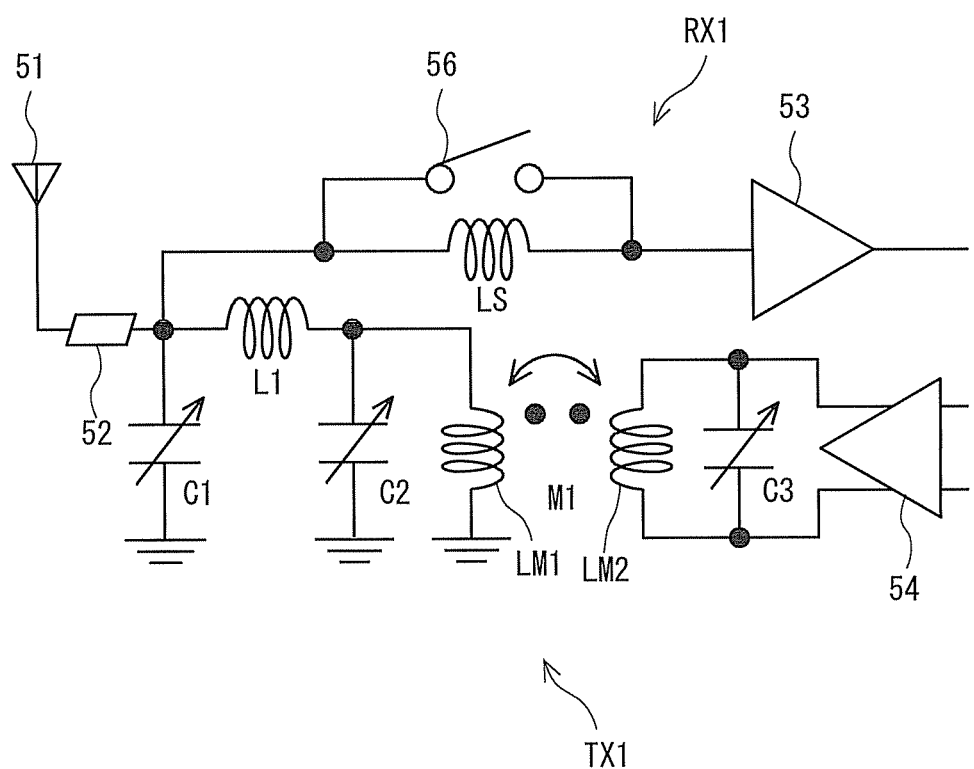
FIG. 11 is a circuit configuration of a communication circuit according to a fourth embodiment.

A configuration of a communication circuit to which the semiconductor device 100, 100a, or 100b is applied is explained with reference to FIG. 11. FIG. 11 is a circuit diagram showing a configuration of a part of a communication circuit 50. Specifically, FIG. 11 shows a circuit corresponding to the antenna 11, the LNA 13, and the filter 14 shown in FIG. 3. FIG. 11 shows a configuration of a part of a receiving circuit RX1 from an antenna 51 to a reception amplifier 53, and a part of a transmitting circuit TX1 from a transmission amplifier 54 to the antenna 51.

Note that the circuit shown in FIG. 11 is a circuit based on "13.4 A 6.3 mW BLE transceiver embedded RX image-rejection filter and TX harmonic-suppression filter reusing on-chip matching network" 2015 IEEE International Solid-State Circuits Conference.

The communication circuit 50 shown in FIG. 11 is not provided with the switch 12 for changing the component to which the antenna is connected. That is, in the communication circuit 50, the switching between a receiving process and a transmitting process is performed without using the switch 12 shown in FIG. 3.

The communication circuit 50 includes an antenna 51, a terminal 52, capacitors C1 to C3, inductors L1 and LS, a balun circuit (a balance-to-unbalance transformer) M2, a reception amplifier 53, a transmission amplifier 54, and a switch 56.

The antenna 51 is connected to the terminal 52. The terminal 52 is connected to an input terminal of the reception amplifier 53 thorough the inductor LS. Further, the switch 56 and the inductor LS are connected in parallel with each other between the terminal 52 and the reception amplifier 53. The reception amplifier 53, which is a circuit corresponding to the LNA 13 shown in FIG. 3, amplifies a reception signal. The switch 56 is turned on when a transmitting process is performed, and turned off when a receiving process is performed. The output of the reception amplifier 53 is connected to, for example, a mixer through a filter, though it is not shown in FIG. 11.

Further, the capacitors C1 and C2 are connected in parallel with each other between the terminal 52 and a ground. Further, the inductor L1 is disposed between the terminal 52 and the capacitor C2. That is, the inductor L1 and the capacitor C2 are connected in series between the terminal 52 and the ground.

The balun circuit M1 includes two inductors LM1 and LM2. The inductors LM1 and LM2 are coupled with each other through a magnetic-field coupling in a contactless manner. That is, the balun circuit M1 is a transformer. The inductor LM1 of the balun circuit M1 is disposed on the terminal 52 side and the other inductor LM2 is disposed on the transmission amplifier 54 side. One end of the inductor LM1 is connected to the ground and the other end thereof is connected to the capacitor C2 and the inductor L1. That is, the inductor L1 and the inductor LM1 are connected in series with each other between the terminal 52 and the ground. Further, the capacitor C2 and the inductor LM1 are connected in parallel with each other between the inductor L1 and the ground. The transmission amplifier 54 is coupled with the inductor L1 through the balun circuit M1.

The inductor LM2 is connected to two output terminals of the transmission amplifier 54. Further, the capacitor C3 is also connected to the two output terminals of the transmission amplifier 54. That is, the capacitor C3 and the inductor LM2 are connected in parallel with each other between the two output terminals of the transmission amplifier 54. Inputs of the transmission amplifier 54 are connected to, for example, a mixer through a filter, though it is not shown in FIG. 11.

The transmission amplifier 54, which is a circuit corresponding to the PA 21 shown in FIG. 3, amplifies a transmission signal. Each of the capacitors C1 to C3 is a variable capacitor. Impedance matching can be achieved by changing the capacitances of the capacitors C1 to C3.

Figure 12:
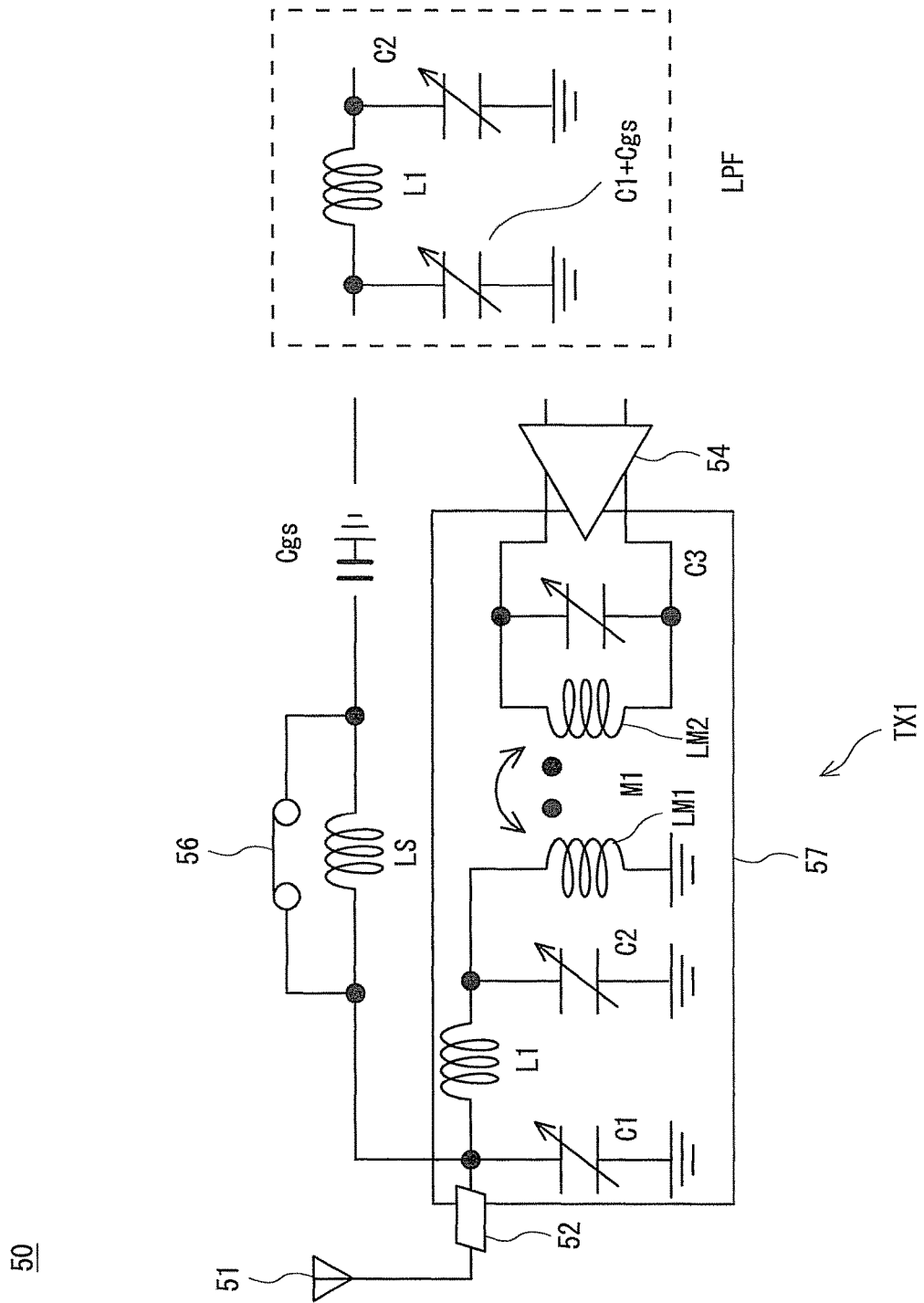
FIG. 12 is a diagram for explaining an operation in a transmitting mode of the communication circuit shown in FIG. 11.

Firstly, a transmitting process performed by the communication circuit 50 is explained with reference to FIG. 12. FIG. 12 shows a circuit (i.e., a state of the above-shown circuit) when a transmitting process is performed. In the transmitting process, the switch 56 is turned on. Therefore, the reception amplifier 53 and the terminal 52 shown in FIG. 11 are brought into conduction. As a result, the inductance component in a path from the terminal 52 to the reception amplifier 53 decreases. When the switch 56 is in an on-state, the impedance for the receiving circuit RX1 estimated (or observed) from the terminal 52 side is a high-impedance. Therefore, in the transmitting process, a signal is not transmitted through the signal path on the receiving side and is transmitted only through the signal path on the transmitting side. Therefore, a radio frequency signal propagates through the signal path of the transmitting circuit TX1.

The reception amplifier 53 is equivalent to (i.e., is expressed as) a capacitor Cgs. Note that in the transmitting circuit TX1, the capacitors C1, C2 and Cgs, and the inductor L1 function as a low-pass filter (indicated by a box drawn by dotted lines in FIG. 12).

Figure 13:
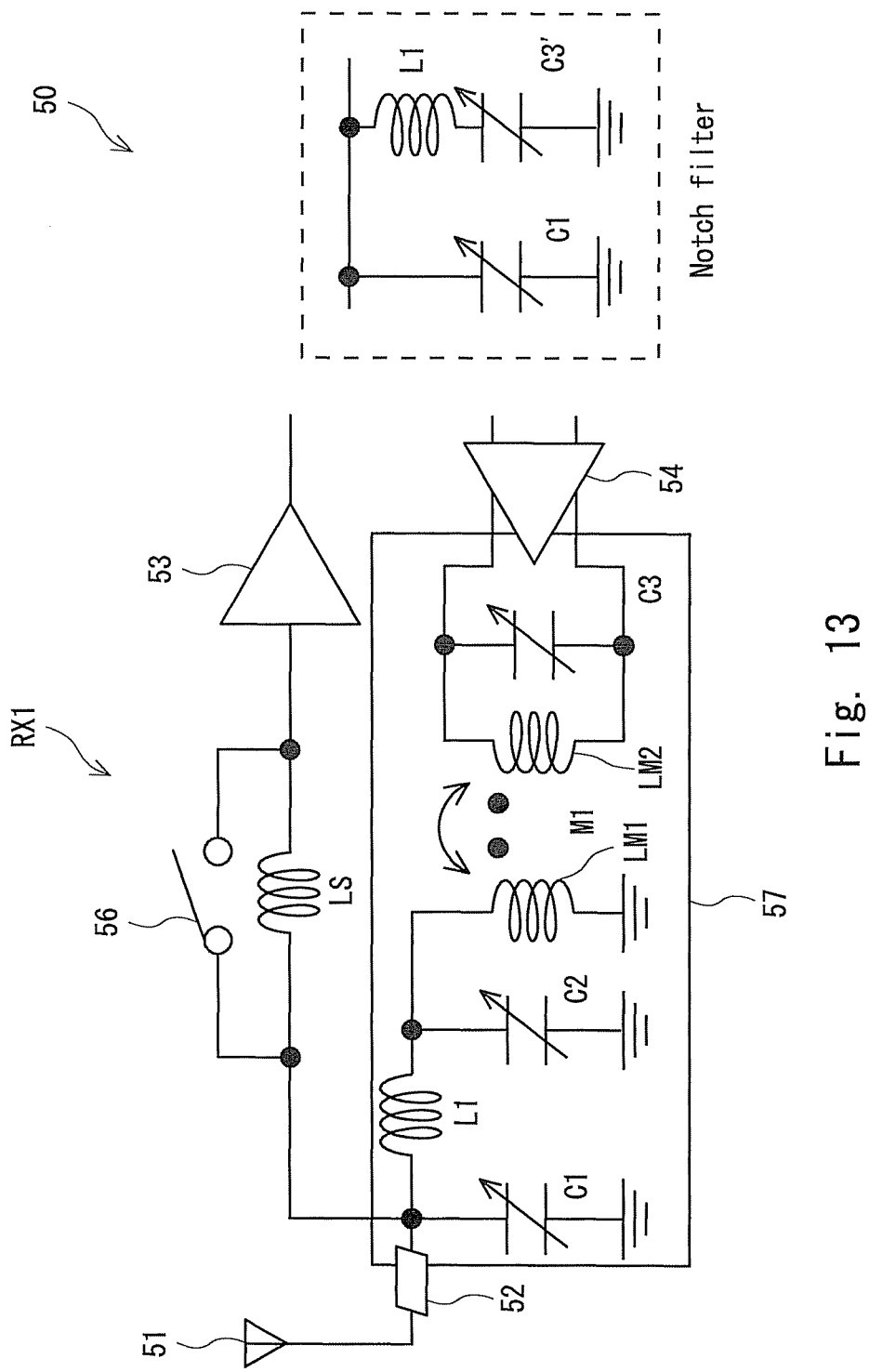
FIG. 13 is a diagram for explaining an operation in a receiving mode of the communication circuit shown in FIG. 11.

A receiving process performed by the communication circuit 50 is explained with reference to FIG. 13. FIG. 13 shows a circuit (i.e., a state of the above-shown circuit)

when a receiving process is performed. The receiving circuit RX1 includes the switch 56, which is connected in parallel with the inductor LS. In the receiving process, the switch 56 is turned off. When the switch 56 is in an off-state, impedance matching is achieved by the inductor LS in the receiving circuit RX1. As a result, a radio frequency signal propagates through the signal path of the receiving circuit RX1. In this state, the capacitors C1 and C3 and the inductor L1 function as a notch filter (indicated by a box drawn by dotted lines in FIG. 13, in which a capacitor C3' represents the capacitor C3 as observed through the balun circuit M1).

At least one of the inductors LM1 and LM2 is regarded as the second inductor 123 and the reception amplifier 53 of the receiving circuit RX1 is regarded as the first circuit 131. That is, since the balun circuit M1 and the reception amplifier 53 do not simultaneously operate, at least one of the inductors LM1 and LM2 is disposed so as to overlap the reception amplifier 53. Further, the inductor LS is regarded as the second inductor 123 and the transmission amplifier 54 of the transmitting circuit TX1 is regarded as the second circuit 132. That is, since the inductor LS and the transmission amplifier 54 do not simultaneously operate, the inductors LS and the transmission amplifier 54 are disposed so as to overlap each other. Therefore, the semiconductor device according to this embodiment can lower the effect of noises. Note that it is possible to regard the inductor L1 as the second inductor 123, instead of regarding the inductors LM1 and LM2 as the second inductor 123.

Fifth Embodiment

In the first to fourth embodiments, the first circuit 131 is a receiving circuit and the second circuit 132 is a transmitting circuit. However, the first and second circuits 131 and 132 are not limited to the receiving circuit and the transmitting circuit. For example, the communication circuit can be a circuit that can cope with a plurality of transmission modes that are used in a selective manner. Ina fifth embodiment, the semiconductor device 100 is applied to a communication circuit capable of performing communication in different communication modes. In different communication modes, radio signals are transmitted/received by using radio frequency signals in different frequency bands. Note that the semiconductor device 100 applied to the communication circuit may be the semiconductor device 100a or 100b.

Figure 14:
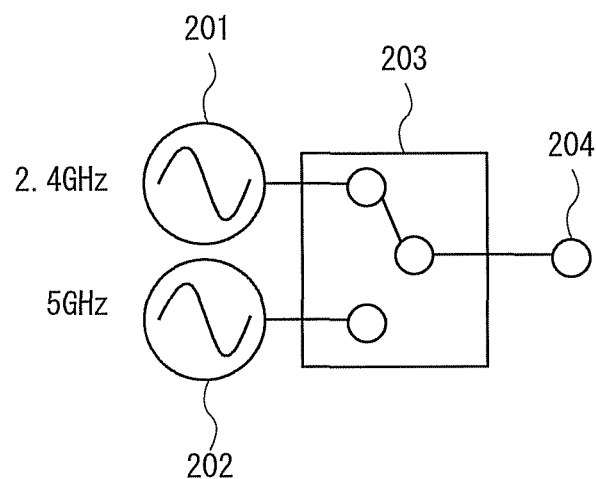
FIG. 14 schematically shows a configuration of a communication circuit according to a fifth embodiment.

A communication circuit 200 according to the fifth embodiment is explained with reference to FIG. 14. FIG. 14 is a circuit diagram schematically showing the communication circuit 200. Note that FIG. 14 shows a simplified diagram of the communication circuit in which some components are omitted as appropriate. For example, filters and mixers are omitted in FIG. 14.

The communication circuit 200 includes the semiconductor device 100 shown in FIG. 1 or the like disposed therein. In this embodiment, the first circuit 131 is a circuit that performs communication in a first communication mode and the second circuit 132 is a circuit that performs communication in a second communication mode. For example, the communication circuit 200 is a communication circuit used for a WiFi (Registered Trademark) communication device. Therefore, the communication circuit 200 performs communication in a first communication mode in which a 2.4 GHz frequency band is used and in a second communication mode in which a 5 GHz frequency band is used.

The communication circuit 200 includes a first oscillator 201, a second oscillator 202, a switch 203, and a terminal 204. Each of the first and second oscillators 201 and 202 is, for example, an LC-VCO (Voltage Controlled Oscillator) including an inductor, a capacitor, and so on. The first oscillator 201 generates a radio frequency signal in a 2.4 GHz frequency band. The second oscillator 202 generates a radio frequency signal in a 5 GHz frequency band.

The switch 203 switches between the first and second oscillators 201 and 202 (i.e., selects one of the first and second oscillators 201 and 202). The switch 203 functions as a switch for selecting a frequency (a communication mode). The terminal 204 is connected to an antenna and the like (not shown). Needless to say, a filter, an amplifier, and the like may be disposed between the terminal 204 and the antenna. The first and second oscillators 201 and 202 operate in a selective manner.

Communication in the first communication mode and communication in the second communication mode are selectively performed. The switch 203 selects the signal path according to the selected communication mode. When communication is performed in the first communication mode, the switch 203 connects the terminal 204 to the first oscillator 201. Further, when communication is performed in the second communication mode, the switch 203 connects the terminal 204 to the second oscillator 202. The switch 203 switches the signal path between the signal path for the first oscillator 201 and that for the second oscillator 202. The switch 203 switches the communication mode between the first and second communication modes.

Further, an inductor included in the first oscillator 201 is regarded as the first inductor 113 and an inductor included in the second oscillator 202 is regarded as the second inductor 123. That is, the first oscillator 201 includes the first inductor 113 and the first circuit 131 shown in FIG. 1 or the like. The second oscillator 202 includes the second inductor 123 and the second circuit 132 shown in FIG. 1 or the like. Therefore, the semiconductor device according to this embodiment can lower the effect of noises caused by the inductors. Further, it is possible to prevent or reduce an increase in circuit size.

Figure 15:
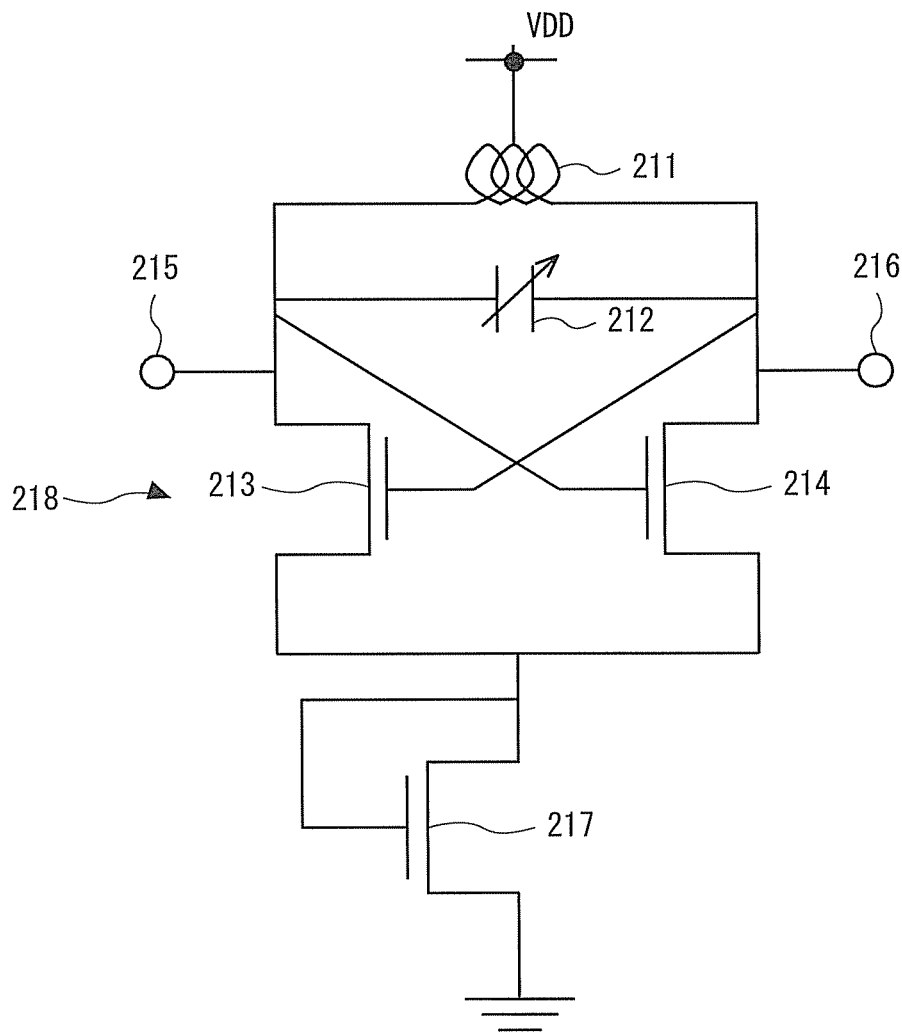
FIG. 15 shows an example of a circuit configuration of a first oscillator.
Figure 16:
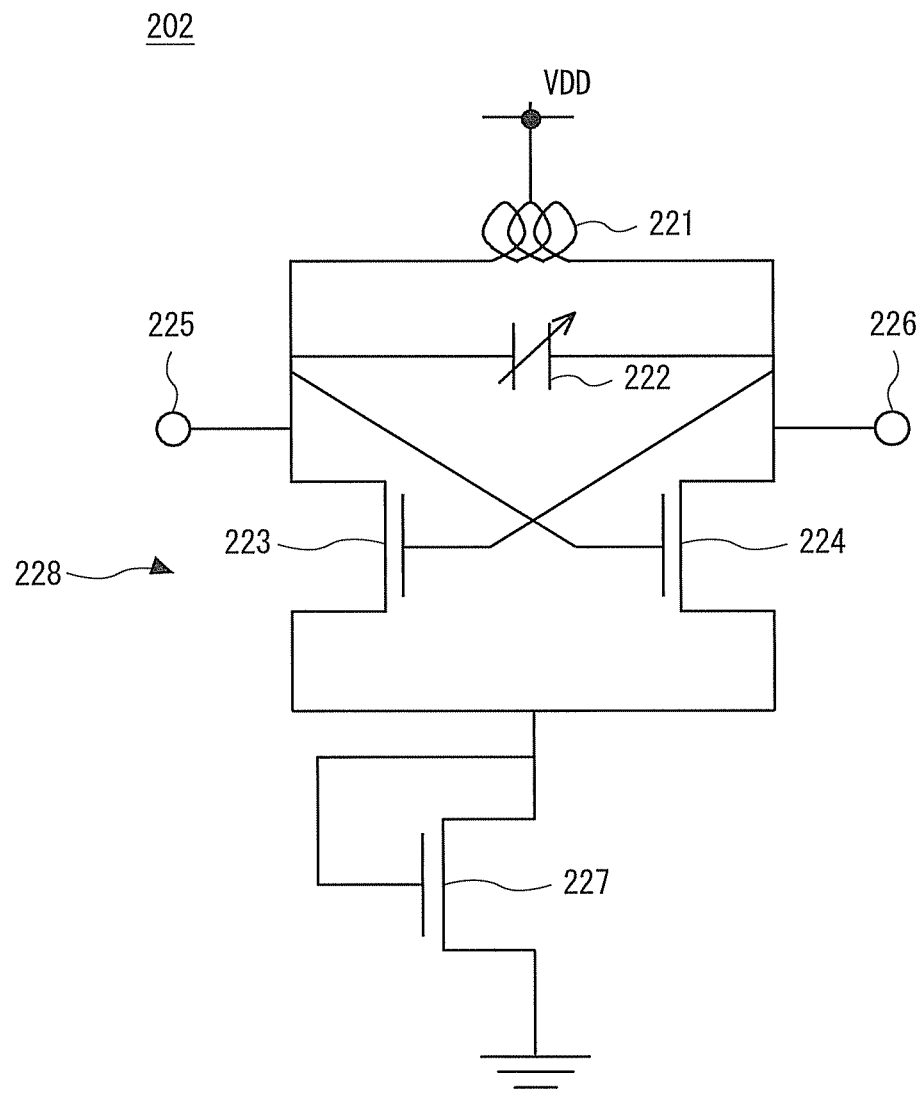
FIG. 16 shows an example of a circuit configuration of a second oscillator.

Circuit configurations of the first and second oscillators 201 and 202 are explained with reference to FIGS. 15 and 16. FIG. 15 is a circuit diagram showing a configuration of the first oscillator 201. FIG. 16 is a circuit diagram showing a configuration of the second oscillator 202. Note that the circuit diagrams shown in FIGS. 15 and 16 are simplified as appropriate.

As shown in FIG. 15, the first oscillator 201 includes an inductor part 211, a variable capacitor part 212, a transistor 213, a transistor 214, an input terminal 215, an output terminal 216, and a transistor 217.

The inductor part 211 and the variable capacitor part 212 are connected in parallel with each other between the input terminal 215 and the output terminal 216. A power supply voltage VDD is supplied to a middle point of the inductor part 211. The variable capacitor part 212 is formed by, for example, a varactor.

A negative resistance part 218 includes the transistor 213 and the transistor 214. Each of the transistors 213 and 214 is an NMOS (N-channel Metal Oxide Transistor) transistor. A gate of the transistor 213 is connected to the output terminal 216 and a drain thereof is connected to the input terminal 215. A drain of the transistor 214 is connected to the output terminal 216 and a gate thereof is connected to the input terminal 215.

The transistor 217 is an NMOS transistor. A drain of the transistor 217 is connected to sources of the transistors 213 and 214. A source of the transistor 217 is connected to a ground. A gate of the transistor 217 is connected to its drain, so that a bias voltage is applied to the gate.

The second oscillator 202 includes an inductor part 221, a variable capacitor part 222, a transistor 223, a transistor 224, an input terminal 225, an output terminal 226, and a transistor 227. A negative resistance part 228 includes the transistor 223 and the transistor 224. The second oscillator 202 has a circuit configuration similar to that of the first oscillator 201.

The inductor part 221, the variable capacitor part 222, the transistor 223, the transistor 224, the input terminal 225, the output terminal 226, and the transistor 227 of the second oscillator 202 correspond to the inductor part 211, the variable capacitor part 212, the transistor 213, the transistor 214, the input terminal 215, the output terminal 216, and the transistor 217, respectively, of the first oscillator 201. Therefore, detailed explanations of the second oscillator 202 are omitted.

The inductor part 211 is regarded as the first inductor 113 and the inductor part 221 is regarded as the second inductor 123. Further, the circuit of the first oscillator 201 other than the first inductor 113 is regarded as the first circuit 131 and the circuit of the second oscillator 202 other than the second inductor 123 is regarded as the second circuit 132.

The first circuit 131 should include at least one of the inductor part 211, the variable capacitor part 212, the transistor 213, the transistor 214, the input terminal 215, the output terminal 216, and the transistor 217. For example, the inductor part 221 is disposed so as to overlap the negative resistance part 218.

The second circuit 132 should include at least one of the inductor part 221, the variable capacitor part 222, the transistor 223, the transistor 224, the input terminal 225, the output terminal 226, and the transistor 227. For example, the inductor part 211 is disposed so as to overlap the negative resistance part 228.

Therefore, the semiconductor device according to this embodiment can lower the effect of noises caused by the inductors. Further, it is possible to prevent or reduce an increase in circuit size.

Sixth Embodiment

Figure 17:
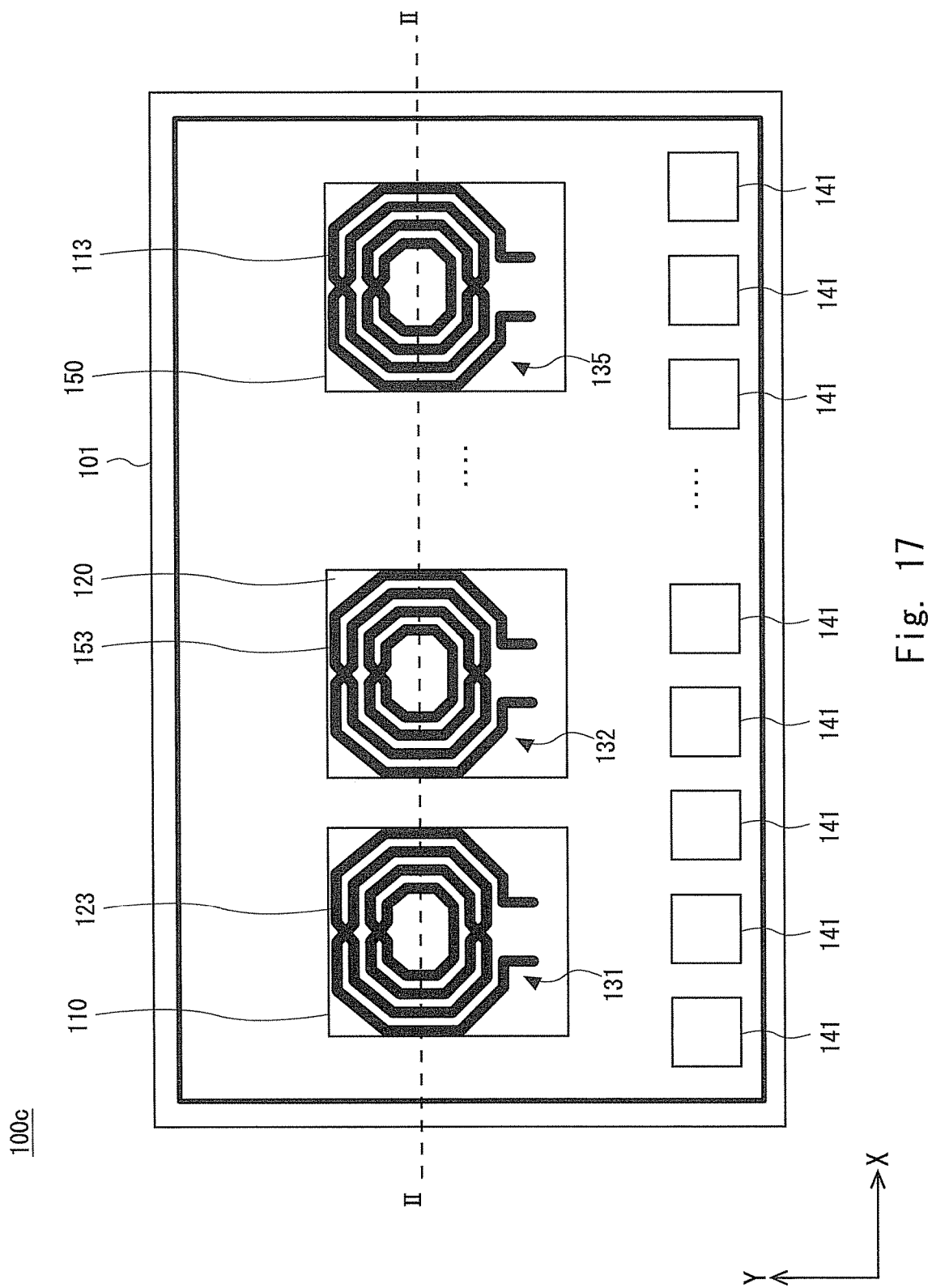
FIG. 17 is a plan view showing a configuration of a semiconductor device according to a sixth embodiment.

In a semiconductor device according to this embodiment, three or more inductors can be disposed. An example in which at least three inductors are disposed is explained hereinafter with reference to FIG. 17. FIG. 17 is a plan view showing a configuration of a semiconductor device 100c according to a sixth embodiment. Note that the number of inductors may be three or more. However, the following explanation is given on the assumption that the number of inductors is three for clarifying the explanation. Further, explanations of matters that are in common with those in the above-described first to fourth embodiments are omitted as appropriate.

The semiconductor device 100c includes a first inductor 113, a second inductor 123, and a third inductor 153. Further, a substrate 101 includes a first area 110, a second area 120, and a third area 150. The first, second and third areas 110, 120 and 150 are arranged in the X-direction. The first, second and third areas 110, 120 and 150 do not overlap each other.

A first circuit 131 is disposed in the first area 110 and a second circuit 132 is disposed in the second area 120. Further, a third circuit 135 is disposed in the third area 150. Further, the second inductor 123 is disposed in the first area 110 and the third inductor 153 is disposed in the second area 120. Further, the third circuit 135 is disposed in the third area 150.

The semiconductor device 100c includes the substrate 101, the first inductor 113 formed above the substrate 101, and the second inductor 123 formed above the substrate 101, in which the second inductor 123 is disposed so as to be shifted from the first inductor 113 in a plan view. Further, the semiconductor device 100c includes the first circuit 131, which is disposed so as to overlap the second inductor 123 in the plan view and configured to operate when the second inductor 123 is not in operation. The semiconductor device 100c includes the third circuit 135, which is disposed so as to overlap the first inductor 113 in the plan view and configured to operate when the first inductor 113 is not in operation.

Further, the semiconductor device 100c includes the second circuit 132, which is disposed so as to overlap the third inductor 153 in the plan view and configured to operate when the third inductor 153 is not in operation. The first, second and third circuits 131, 132 and 135 operate in a selective manner.

As described above, it is possible to decrease the effect of noises even in the semiconductor device 100c including at least three inductors 113, 123 and 153. An inductor and a circuit that overlap each other in the plan view do not simultaneously operate. In other words, a circuit and an inductor that simultaneously operate are disposed so as to be shifted from each other in the plan view. Therefore, the semiconductor device according to this embodiment can reduce the effect of noises caused by the inductors. Further, since a circuit(s) that does not operate simultaneously with an inductor can be disposed directly below the inductor, an increase in circuit size can be prevented or reduced.

Figure 18:
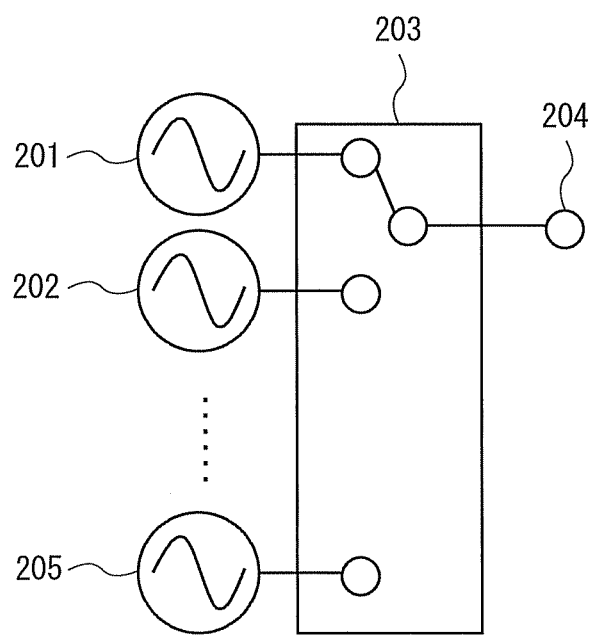
FIG. 18 shows an example of a communication circuit with the semiconductor device according to the sixth embodiment disposed therein.

An example of a communication circuit with a semiconductor device 100c according to this embodiment disposed therein is explained with reference to FIG. 18. FIG. 18 schematically shows a circuit configuration of a communication circuit 200a. Similarly to the communication circuit 200 shown in FIG. 14, the communication circuit 200a is a circuit capable of switching its communication mode among a plurality of communication modes. Further, although an example in which the communication mode is switched among three communication modes is explained hereinafter, the number of communication modes from which the communication mode to be used is selected may be four or more The communication circuit 200a shown in FIG. 18 includes a third oscillator 205 in addition to the components of the communication circuit 200 shown in FIG. 14. Note that the configuration of the communication circuit 200a other than the third oscillator 205 is similar to that of the communication circuit 200 and hence its explanation is omitted as appropriate. A switch 203 switches a signal path among signals paths for the first, second and third oscillators 201, 202 and 205.

The first oscillator 201 has a configuration similar to that shown in FIG. 15. The first oscillator 201 includes a first inductor 113 and a first circuit 131. That is, the first inductor 113 is used for the first oscillator 201 that generates a radio frequency signal in a first frequency band.

The second oscillator 202 has a configuration similar to that shown in FIG. 16. The second oscillator 202 includes a second inductor 123 and a second circuit 132. That is, the second inductor 123 is used for the second oscillator 202 that generates a radio frequency signal in a second frequency band.

The third oscillator 205 has a configuration similar to that shown in FIG. 15 or 16. The third oscillator 205 includes a third inductor 153 and a third circuit 135. That is, the third inductor 153 is used for the third oscillator 205 that generates a radio frequency signal in a third frequency band. The third frequency band differs from both of the first and second frequency bands.

Therefore, an inductor and a circuit that simultaneously operate are disposed so as not to overlap each other. Therefore, the semiconductor device according to this embodiment can reduce the effect of noises caused by the inductors. Further, since a circuit(s) that does not operate simultaneously with an inductor can be disposed directly below the inductor, an increase in circuit size can be prevented or reduced.

Modified Example

Figure 19:
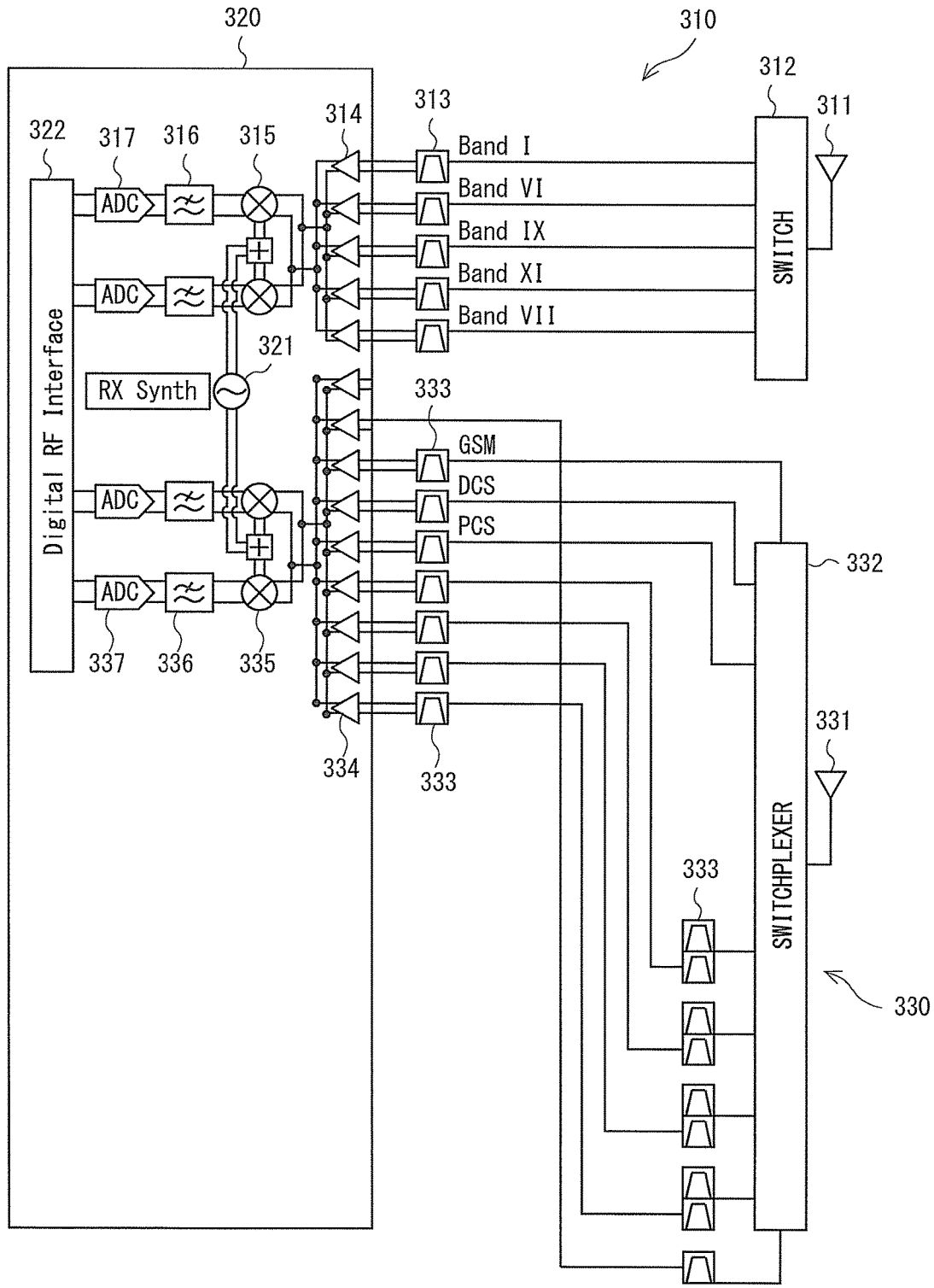
FIG. 19 is a block diagram showing a configuration of a communication circuit according to a modified example.

A modified example of the communication circuit according to the sixth embodiment is explained with reference to FIG. 19. FIG. 19 is a block diagram showing a circuit configuration of a communication circuit 300.

For clarifying the explanation, FIG. 19 shows only a receiving circuit while omitting a transmitting circuit as appropriate. The communication circuit 300 changes a communication standard among a plurality of communication standards and performs communication in accordance with the selected communication mode. For example, the communication circuit 300 can change its communication mode among LTE (Long Term Evolution), GSM (Registered Trademark) (Global System for Mobile communications), DCS, and PCS (Pulse Code Modulation). In the LTE communication, bands I, VI, IX, XI and VII are used. The band (i.e., the frequency band) to be used is switched among these bands.

A communication circuit 310 for LTE communication includes a first antenna 311, a switch 312, a filter 313, an amplifier 314, a mixer 315, a filter 316, an A/D converter 317, and an interface 322.

The first antenna 311 receives a radio signal from space. The switch 312 switches (i.e., selects) a reception signal according to the frequency band and outputs the reception signal to the filter 313. The filter 313 removes unnecessary frequency bands from the reception signal and outputs the resultant reception signal to the amplifier 314. The amplifier 314 amplifies the reception signal and output the amplified reception signal to the mixer 315. The mixer 315 demodulates the reception signal by using a local signal. The filter 316 removes unnecessary band components (i.e., unnecessary frequency components) included in the demodulated reception signal and outputs the resultant reception signal to the A/D converter 337. The A/D converter 337 converts the analog reception signal into a digital signal. Then, the reception signal, which has been converted into the digital signal, is output from the digital and analog interface 322. In the communication circuit 310 for LTE communication, circuits such as filters are switched (i.e., selected) according to the frequency band. A filter 313 and an amplifier 314 are provided for each band.

A communication circuit 330 for GSM communication includes a second antenna 331, a switchplexer 332, a filter 333, an amplifier 334, a mixer 335, a filter 336, an A/D converter 337, and the digital and analog interface 322.

The second antenna 331 receives a radio signal from space. The switchplexer 332 switches (i.e., selects) a reception signal according to the frequency band and outputs the reception signal to the filter 333. The filter 333 removes unnecessary frequency bands from the reception signal and outputs the resultant reception signal to the amplifier 334. The amplifier 334 amplifies the reception signal and output the amplified reception signal to the mixer 335. The mixer 335 demodulates the reception signal by using a local signal. The filter 336 removes unnecessary band components (i.e., unnecessary frequency components) included in the demodulated reception signal and outputs the resultant reception signal to the A/D converter 337. The A/D converter 337 converts the analog reception signal into a digital signal. Then, the reception signal, which has been converted into the digital signal, is output from the digital and analog interface 322.

For example, an inductor included in the communication circuit 310 is regarded as the first inductor 113 and an inductor included in the communication circuit 330 is regarded as the second inductor 123. Further, the circuit of the communication circuit 310 other than the inductor may be regarded as the first circuit 131 shown in FIG. 1. That is, the first circuit 131 should include at least a part of (or one of) the switch 312, the filter 313, the amplifier 314, the mixer 315, the filter 316, and the A/D converter 317.

Further, the circuit of the communication circuit 330 other than the inductor may be regarded as the second circuit 132 shown in FIG. 2. That is, the second circuit 132 should include at least a part of (or one of) the switchplexer 332, the filter 333, the amplifier 334, the mixer 335, the filter 336, and the A/D converter 337.

Therefore, an inductor and a circuit that simultaneously operate are disposed so as not to overlap each other. Therefore, the semiconductor device according to this embodiment can reduce the effect of noises caused by the inductors. Further, since a circuit(s) that does not operate simultaneously with an inductor can be disposed directly below the inductor, an increase in circuit size can be prevented or reduced.

Further, in the communication circuit 310 for LTE, when the operation of the circuit is switched by switching the frequency band, the semiconductor device 100 according to this embodiment can be used. For example, an inductor of the filter or the amplifier for the band I can be regarded as the first inductor 113 and an inductor of the filter or the amplifier for the band VI can be regarded as the second inductor 123. Further, when similar switching is performed for a transmitting circuit, the semiconductor device 100 according to this embodiment can be used. By the above-described configurations, it is possible to provide a circuit having a high noise tolerance and a small size in a semiconductor device 100 capable of coping with communication standards of various countries.

Note that the above-described first to fifth embodiments can be combined as desired. For example, the shield pattern shown in the third embodiment can be used in the first embodiment. Further, any of the semiconductor devices 100 to 100c shown in the first, second, third and fifth embodiments can be applied to the communication circuit 10, 50, 200, 200a or 300. The first to fifth embodiments can be combined as desirable by one of ordinary skill in the art.

The whole or part of the embodiments disclosed above can be described as, but not limited to, the following supplementary notes.

Supplementary Note 1

A semiconductor device comprising:
a substrate;
a first circuit disposed in a first area of the substrate;

a second circuit disposed in a second area of the substrate, the second circuit being configured to operate selectively with the first circuit;

a first inductor disposed in the second area and connected to the first circuit; and a second inductor disposed in the first area and connected to the second circuit.

Supplementary Note 2

The semiconductor device described in Supplementary note 1, further comprising:

a first guard ring formed so as to surround the second inductor in a plan view; and a second guard ring formed so as to surround the first inductor in the plan view, wherein the first guard ring is a power supply line or a ground line for the first circuit, and the second guard ring is a power supply line or a ground line for the second circuit.

Supplementary Note 3

The semiconductor device described in Supplementary note 1, further comprising a shield pattern formed by a wiring layer included in the first and second circuits, wherein the wiring layer comprises a passivation layer formed above the shield pattern, and the first and second inductors are disposed above the passivation layer.

Supplementary Note 4

The semiconductor device described in Supplementary note 1, wherein the first circuit is connected to the first inductor through a first wiring line formed so as to extend from the first area to the second area, and the second circuit is connected to the second inductor through a second wiring line formed so as to extend from the second area to the first area.

Supplementary Note 5

The semiconductor device described in Supplementary note 1, further comprising:

a receiving circuit comprising the first circuit and the first inductor; and a transmitting circuit comprising the second circuit and the second inductor.

Supplementary Note 6

The semiconductor device described in Supplementary note 5, wherein the receiving circuit comprises a reception amplifier circuit configured to amplify a reception signal, the transmitting circuit comprises a transmission amplifier circuit configured to amplify a transmission signal, the reception amplifier circuit comprises the first circuit and the first inductor, and the transmission amplifier circuit comprises the second circuit and the second inductor.

Supplementary Note 7

A communication circuit comprising a semiconductor device described in Supplementary note 5, further comprising:

an antenna configured to transmit/receive a radio signal; and a switch configured to selectively connects the receiving circuit or the transmitting circuit to the antenna.

Supplementary Note 8

A communication circuit comprising a semiconductor device described in Supplementary note 5, further comprising:

a switch connected in parallel with the first inductor;

a reception amplifier connected to the switch and the first inductor; and a transmission amplifier connected to the first inductor through a transformer, wherein the switch is turned off when a receiving process is performed and is turned on when a transmitting process is performed.

Supplementary Note 9

The semiconductor device described in Supplementary note 1, wherein each of the first and second circuits comprises at least one of a capacitor and a MOS transistor.

Supplementary Note 10

The semiconductor device described in Supplementary note 1, wherein the first and second areas are arranged adjacent to each other.

Supplementary Note 11

A communication circuit comprising a semiconductor device described in Supplementary note 1, wherein the first circuit performs a communication process by using a radio frequency signal in a first frequency band, and the second circuit performs a communication process by using a radio frequency signal in a second frequency band different from the first frequency band.

Supplementary Note 12

The communication circuit described in Supplementary note 11, further comprising:

a first oscillator comprising the first circuit and the first inductor, the first oscillator being configured to generate the radio frequency signal in the first frequency band, and a second oscillator comprising the second circuit and the second inductor, the second oscillator being configured to generate the radio frequency signal in the second frequency band.

Supplementary Note 13

The communication circuit described in Supplementary note 12, further comprising a switch configured to switch a signal path between a signal path for the first oscillator and that for the second oscillator.

Supplementary Note 14

A semiconductor device comprising:

a substrate;

a first inductor formed above the substrate;

a second inductor formed above the substrate, the second inductor being disposed so as to be shifted from the first inductor in a plan view;

a circuit disposed so as to overlap the second inductor in the plan view, the circuit being configured to operate when the second inductor is not in operation; and a circuit disposed so as to overlap the first inductor in the plan view, the circuit being configured to operate when the first inductor is not in operation Supplementary Note 15

The semiconductor device described in Supplementary note 14, wherein the first inductor is used for a first oscillator for generating a radio frequency signal in a first frequency band, and the second inductor is used for a second oscillator for generating a radio frequency signal in a second frequency band.

Supplementary Note 16

A semiconductor device comprising described in Supplementary note 14 further:

a third inductor formed above the substrate, the third inductor being disposed so as to be shifted from the first and second inductors in a plan view; and a circuit disposed so as to overlap the third inductor in the plan view, the circuit being configured to operate when the third inductor is not in operation.

Supplementary Note 17

The semiconductor device described in Supplementary note 16, wherein the first inductor is used for a first oscillator for generating a radio frequency signal in a first frequency band, the second inductor is used for a second oscillator for generating a radio frequency signal in a second frequency band different from the first frequency band, and the third inductor is used for a third oscillator for generating a radio frequency signal in a third frequency band different from the first and second frequency bands.

Supplementary Note 18

A communication circuit comprising a semiconductor device described in Supplementary note 15, further comprising a switch configured to switch a communication mode between a first communication mode using the radio frequency signal in the first frequency band and a second communication mode using the radio frequency signal in the second frequency band.

Supplementary Note 19

A communication circuit comprising a receiving circuit and a transmitting circuit disposed in a substrate, wherein the receiving circuit comprises:

a first circuit formed in a first area of the substrate; and
a first inductor formed in a second area of the substrate, and the transmitting circuit comprises:
a second circuit formed in the second area of the substrate; and
a second inductor formed in the first area of the substrate.

Supplementary Note 20

The communication circuit described in Supplementary note 19, wherein the second circuit is disposed directly below the first inductor, and the first circuit is disposed directly below the second inductor.

Supplementary Note 21

The communication circuit described in Supplementary note 19, further comprising:

a first guard ring formed so as to surround the second inductor in a plan view; and a second guard ring formed so as to surround the first inductor in the plan view, wherein the first guard ring is a power supply line or a ground line for the first circuit, and the second guard ring is a power supply line or a ground line for the second circuit.

Supplementary Note 22

The communication circuit described in Supplementary note 19, further comprising a shield pattern formed by a wiring layer included in the first and second circuits, wherein the wiring layer comprises a passivation layer formed above the shield pattern, and the first and second inductors are disposed above the passivation layer.

Supplementary Note 23

The communication circuit described in Supplementary note 19, wherein the receiving circuit comprises a reception amplifier circuit configured to amplify a reception signal, the transmitting circuit comprises a transmission amplifier circuit configured to amplify a transmission signal, the reception amplifier circuit comprises the first circuit and the first inductor, and the transmission amplifier circuit comprises the second circuit and the second inductor.

Supplementary Note 24

The communication circuit described in Supplementary note 19, comprising:

an antenna configured to transmit/receive a radio signal; and a switch configured to selectively connects the receiving circuit or the transmitting circuit to the antenna.

Supplementary Note 25

The communication circuit described in Supplementary note 19, comprising:

a switch connected in parallel with the first inductor; and
a reception amplifier connected to the switch and the first inductor, wherein the transmitting circuit comprises a transmission amplifier connected to the first inductor through a transformer, and the switch is turned off when a receiving process is performed and is turned on when a transmitting process is performed.

Supplementary Note 26

A communication circuit comprising a first communication circuit and a second communication circuit disposed in a substrate, wherein
the first communication circuit, which performs a communication process by using a radio frequency signal in a first frequency band, comprises:
a first inductor; and
a first circuit formed in a first area of the substrate, and
the second communication circuit, which performs a communication process by using a radio frequency signal in a second frequency band different from the first frequency band, comprises:
a second inductor formed in the first area; and
a second circuit formed in a second area of the substrate.

Supplementary Note 27

The communication circuit described in Supplementary note 26, wherein the first inductor is formed in the second area.

Supplementary Note 28

The communication circuit described in Supplementary note 27, wherein
the second circuit is disposed directly below the first inductor, and
the first circuit is disposed directly below the second inductor.

Supplementary Note 29

The communication circuit described in Supplementary note 28, wherein
the first communication circuit comprises a first oscillator configured to generate the radio frequency signal in the first frequency band by using the first inductor, and
the second communication circuit comprises a second oscillator configured to generate the radio frequency signal in the second frequency band by using the second inductor.

Supplementary Note 30

The communication circuit described in Supplementary note 29, further comprising a switch configured to switch a signal path between a signal path for the first oscillator and that for the second oscillator.

Supplementary Note 31

The communication circuit described in Supplementary note 26, further comprising a third communication circuit configured to perform communication using a third frequency band different from the first and second frequency bands, wherein
the third communication circuit comprises:
a third circuit formed in a third area of the substrate; and
a third inductor formed in the second area.

Supplementary Note 32

The communication circuit described in Supplementary note 31, wherein
the first communication circuit comprises a first oscillator configured to generate a radio frequency signal in a first frequency band by using the first inductor;
the second communication circuit comprises a second oscillator configured to generate a radio frequency signal in a second frequency band by using the second inductor; and
the third communication circuit comprises a third oscillator configured to generate a radio frequency signal in a third frequency band by using the third inductor.

Supplementary Note 33

The communication circuit described in Supplementary note 32, further comprising a switch configured to switch a signal path among signal paths for the first, second and third oscillators.

Supplementary Note 34)

The semiconductor device described in Supplementary note 14, further comprising:
a first guard ring formed so as to surround the second inductor in a plan view; and
a second guard ring formed so as to surround the first inductor in the plan view, wherein
the first guard ring is a power supply line or a ground line of the circuit that overlaps the first inductor, and
the second guard ring is a power supply line or a ground line of the circuit that overlaps the second inductor.

Supplementary Note 35

The semiconductor device described in Supplementary note 14, further comprising a shield pattern formed by a wiring layer located below the first and second inductors, wherein
a passivation layer disposed in a layer located below the first and second inductors, the passivation layer being disposed so as to surround the shield pattern.

Supplementary Note 36

The semiconductor device described in Supplementary note 6, wherein
the reception amplifier circuit comprises an impedance matching circuit comprising the first inductor and the first circuit, and
the transmission amplifier circuit comprises an impedance matching circuit comprising the second inductor and the second circuit.

Supplementary Note 37

The communication circuit described in Supplementary note 23, wherein
the reception amplifier circuit comprises an impedance matching circuit comprising the first inductor and the first circuit, and
the transmission amplifier circuit comprises an impedance matching circuit comprising the second inductor and the second circuit.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a substrate;
   a first circuit disposed in a first area of the substrate;
   a second circuit disposed in a second area of the substrate, the second circuit being configured to operate selectively with the first circuit;
   a first inductor disposed in the second area and connected to the first circuit, a center portion of the first inductor overlapping the second circuit in a plan view; and
   a second inductor disposed in the first area and connected to the second circuit, a center portion of the second inductor overlapping the first circuit in the plan view.

2. The semiconductor device according to claim 1, further comprising:
   a first guard ring surrounding the second inductor in the plan view; and
   a second guard ring surrounding the first inductor in the plan view, wherein
   the first guard ring is a power supply line or a ground line for the first circuit, and
   the second guard ring is a power supply line or a ground line for the second circuit.

3. The semiconductor device according to claim 1, further comprising a shield pattern formed by a wiring layer included in the first and second circuits, wherein
   the wiring layer comprises a passivation layer formed above the shield pattern, and
   the first and second inductors are disposed above the passivation layer.

4. The semiconductor device according to claim 1, wherein
   the first circuit is connected to the first inductor through a first wiring line extending from the first area to the second area, and
   the second circuit is connected to the second inductor through a second wiring line extending from the second area to the first area.

5. The semiconductor device according to claim 1, further comprising:
   a receiving circuit comprising the first circuit and the first inductor; and
   a transmitting circuit comprising the second circuit and the second inductor.

6. The semiconductor device according to claim 5, wherein
   the receiving circuit comprises a reception amplifier circuit configured to amplify a reception signal,
   the transmitting circuit comprises a transmission amplifier circuit configured to amplify a transmission signal,
   the reception amplifier circuit comprises the first circuit and the first inductor, and
   the transmission amplifier circuit comprises the second circuit and the second inductor.

7. A communication circuit comprising a semiconductor device according to claim 5, further comprising:
   an antenna configured to transmit/receive a radio signal; and
   a switch configured to selectively connect the receiving circuit or the transmitting circuit to the antenna.

8. A communication circuit comprising a semiconductor device according to claim 5, further comprising:
   a switch connected in parallel with the first inductor;
   a reception amplifier connected to the switch and the first inductor; and
   a transmission amplifier connected to the first inductor through a transformer, and
   the switch is turned off when the receiving circuit performs a receiving process and is turned on when the transmitting circuit performs a transmitting process.

9. The semiconductor device according to claim 1, wherein each of the first and second circuits comprises at least one of a capacitor and a MOS transistor.

10. The semiconductor device according to claim 1, wherein the first and second areas are arranged adjacent to each other.

11. A communication circuit comprising a semiconductor device according to claim 1, wherein
    the first circuit performs a communication process by using a radio frequency signal in a first frequency band, and
    the second circuit performs a communication process by using a radio frequency signal in a second frequency band different from the first frequency band.

12. The communication circuit according to claim 11, further comprising:
    a first oscillator comprising the first circuit and the first inductor, the first oscillator being configured to generate the radio frequency signal in the first frequency band, and
    a second oscillator comprising the second circuit and the second inductor, the second oscillator being configured to generate the radio frequency signal in the second frequency band.

13. The communication circuit according to claim 12, further comprising a switch configured to switch a signal path between a signal path for the first oscillator and a signal path for the second oscillator.

14. A semiconductor device comprising:
    a substrate;
    a first inductor formed above the substrate;
    a second inductor formed above the substrate, the second inductor shifted from the first inductor in a plan view;
    a circuit overlapping the second inductor in the plan view and being configured to operate when the second inductor is not in operation; and
    a circuit overlapping the first inductor in the plan view and being configured to operate when the first inductor is not in operation.

15. The semiconductor device according to claim 14, wherein
    the first inductor is included in a first oscillator for generating a radio frequency signal in a first frequency band, and
    the second inductor is included in a second oscillator for generating a radio frequency signal in a second frequency band.

16. The semiconductor device according to claim 14 further comprising:
    a third inductor formed above the substrate, the third inductor shifted from the first and second inductors in the plan view; and
    a circuit overlapping the third inductor in the plan view and being configured to operate when the third inductor is not in operation.

17. The semiconductor device according to claim 16, wherein the first inductor is included in a first oscillator for generating a radio frequency signal in a first frequency band, the second inductor is included in a second oscillator for generating a radio frequency signal in a second frequency band different from the first frequency band, and the third inductor is included in a third oscillator for generating a radio frequency signal in a third frequency band different from the first and second frequency bands.

18. A communication circuit comprising a semiconductor device according to claim 15, further comprising a switch configured to switch a communication mode between a first communication mode using the radio frequency signal in the first frequency band and a second communication mode using the radio frequency signal in the second frequency band.

19. A communication circuit comprising a receiving circuit and a transmitting circuit disposed in a substrate, wherein the receiving circuit comprises:
    a first circuit formed in a first area of the substrate; and
    a first inductor formed in a second area of the substrate, and the transmitting circuit comprises:
    a second circuit formed in the second area of the substrate; and
    a second inductor formed in the first area of the substrate.

20. The communication circuit according to claim 19, wherein the second circuit is disposed directly below the first inductor, and the first circuit is disposed directly below the second inductor.

* * * * *